United States Patent [19]
Diorio et al.

[11] Patent Number: 5,627,392
[45] Date of Patent: May 6, 1997

[54] SEMICONDUCTOR STRUCTURE FOR LONG TERM LEARNING

[75] Inventors: Christopher J. Diorio, Torrance; Paul E. Hasler, Pasadena; Bradley A. Minch, Pasadena; Carver A. Mead, Pasadena, all of Calif.

[73] Assignee: California Institute of Technology, Pasadena, Calif.

[21] Appl. No.: 399,966

[22] Filed: Mar. 7, 1995

[51] Int. Cl.$^6$ .................................................. H01L 29/788
[52] U.S. Cl. ....................... 257/315; 257/316; 257/321; 257/345; 365/185.03; 365/185.28
[58] Field of Search ................................. 257/315, 316, 257/317, 321, 322, 345; 365/185, 189

[56] References Cited

U.S. PATENT DOCUMENTS

| | | | |
|---|---|---|---|
| 4,622,656 | 11/1986 | Kamiya et al. | 365/185 |
| 4,822,750 | 4/1989 | Perlegos et al. | 437/52 |
| 4,935,702 | 6/1990 | Mead et al. | 330/9 |
| 4,953,928 | 9/1990 | Anderson et al. | 357/23.5 |
| 5,059,920 | 10/1991 | Anderson et al. | 330/253 |
| 5,068,622 | 11/1991 | Mead et al. | 330/253 |
| 5,160,899 | 11/1992 | Anderson et al. | 330/288 |
| 5,166,562 | 11/1992 | Allen et al. | 307/571 |
| 5,331,215 | 7/1994 | Allen et al. | 307/201 |
| 5,336,936 | 8/1994 | Allen et al. | 307/201 |
| 5,345,418 | 9/1994 | Challa | 365/185 |

OTHER PUBLICATIONS

For Background Information: Electronic Engineering Times, Monday, Jul. 3, 1995, Issue 855, pp. 1, 31, "Carver Mead's CalTech lab unveils its VLSI cerebral–cortex: Neural team bares silicon brain", R. Colin Johnson.

For Background Information: Electronic Engineering Times, Monday, Jul. 17, 1995, Issue 857, pp. 1, 37–38, "Analog and digital techniques to create a new 'art form': Mead envisions new design era", R. Colin Johnson.

Bertrand Hochet, et al., "Implementation of a Learning Kohonen Neuron Based on a New Multilevel Storage Technique", IEEE J. Solid–State Circuits, vol. 26, No. 3, Mar. 1991, pp. 262–267.

Sanchez, et al., "Review of carrier injection in the silicon/silicon–dioxide system", IEE Proceedings–G, vol. 138, No. 3, Jun. 1991, pp. 377–389.

John Lazzaro, et al., "Systems Technologies for Silicon Auditory Models", IEEE Micro, Jun. 1994, pp. 7–15.

Paul W. Hollis, et al., "A Neural Network Learning Algorithm Tailored for VLSI Implementation", IEEE Trans. on Neural Networks, vol. 5, No. 5, Sep. 1994, pp. 784–791.

*Primary Examiner*—Minhloan Tran
*Attorney, Agent, or Firm*—D'Alessandro & Ritchie

[57] ABSTRACT

A silicon MOS transistor with a time-varying transfer function is provided which may operate both as a single transistor analog learning device and as a single transistor non-volatile analog memory. The time-varying transfer function is achieved by adding or removing electrons from the fully insulated floating gate of an N-type MOS floating gate transistor. The transistor has a control gate capacitively coupled to the floating gate; it is from the perspective of this control gate that the transfer function of the transistor is modified. Electrons are removed from the floating gate via Fowler-Nordheim tunneling. Electrons are added to the floating gate via hot-electron injection.

42 Claims, 9 Drawing Sheets

SEMICONDUCTOR STRUCTURE FOR LONG TERM LEARNING

STATEMENT AS TO RIGHTS TO THE INVENTION

The present invention was made with support from the United States Government under Grant number N00014-89-J-1675 awarded by the Office of Naval Research of the Department of the Navy and under Grant number N00014-89-J-3083 awarded by the Advanced Research Projects Agency of the Department of Defense. The United States Government has certain rights in the invention.

BACKGROUND OF THE INVENTION

1. Field of the Invention

The present invention relates generally to silicon structures for performing the learning function in neural networks and like systems. More particularly, the present invention relates to a single transistor analog floating gate MOS memory device which incorporates a capability for simultaneous memory reading and writing as part of the normal MOSFET device operation and which is suitable for performing long-term learning in silicon integrated circuits.

2. The Prior Art

One impediment to the development of silicon learning networks is the difficulty in storing analog weight values on-chip. Prior efforts typically used capacitive storage with clocked refresh, B. Hochet, et al., "Implementation of a Learning Kohonen Neuron Based on a New Multilevel Storage Technique," IEEE J. Solid-State Circuits, Vol. 26, No. 3, 1991, pp. 262–267, or storage of a multi-bit digital equivalent word, P. Hollis, et al., "A Neural Network Learning Algorithm Tailored for VLSI Implementation," IEEE Tran. Neural Networks, Vol. 5, No. 5, 1994, pp. 784–791. Both of these approaches pay a large price in terms of cell size, resolution, complexity and power consumption.

To achieve a substantial improvement over current technology silicon learning systems a single transistor learning device with the following attributes would be very valuable:

1. Non-volatile analog storage;
2. Bi-directional memory writing;
3. Support for simultaneous memory reading and writing;
4. On-chip read/write driver circuitry operating off of a single polarity voltage supply;
5. Low power consumption;
6. Compact size; and
7. Compatibility with standard silicon MOS processing.

Prior art floating gate transistors, which use electrical charge stored on a floating polysilicon gate embedded in an insulator such as silicon dioxide, provide suitable non-volatile analog storage. The charge on such a floating gate is known to remain fixed for periods of many years. Although the advantages of using floating gate transistors as memory elements are well known, J. Lazzaro, et al., "Systems Technologies for Silicon Auditory Models," IEEE Micro, Vol. 14, No. 3, 1994, pp. 7–15, T. Allen, et al., U.S. Pat. No. 5,166,562, entitled: "Writable Analog Reference Voltage Storage Device," their application to silicon learning networks has been limited. The principal reason has been the lack of a suitable bi-directional mechanism for writing the analog memory. Since the gate of a floating gate transistor is completely embedded within an insulator, writing the memory involves moving charge carriers through this insulator. Two mechanisms are known which will move electrons through an insulator. These are tunneling and hot-electron injection. The inherent difficulty in performing these operations has been the primary impediment to implementation of floating gate transistors in silicon learning systems.

The difficulty in transporting electrons across the barrier presented by the silicon/oxide interface is depicted in FIG. 1A. Surmounting the barrier requires that an electron possess more than about 3.1 eV of energy. At room temperature the probability that semiconductor electrons will possess this energy is exceedingly small. Alternatively, an electron could tunnel through this barrier; however, at the voltages and oxide thicknesses used in conventional silicon MOS processing, the tunneling probability is also exceedingly small.

Fowler-Nordheim tunneling involves applying a voltage across the oxide, as shown in FIG. 1B, which enhances the probability of an electron tunneling through it. Tunneling current vs. oxide voltage for a 400Å, $SiO_2$ gate oxide typical of a 2 μm MOS process is shown in FIG. 1C. Bi-directional oxide currents are required to achieve the learning and unlearning functions necessary in a silicon learning cell. Although the tunneling process has no preferred direction, bi-directional tunneling requires either dual polarity high voltages, or a single polarity high voltage and a means for pulling the floating gate to this voltage when adding electrons, and pulling it near ground when removing them. Both approaches are unattractive. The dual polarity solution requires a negative voltage much lower than the substrate potential; the single polarity solution does not support simultaneous memory reading and writing.

Single polarity bi-directional tunneling is often used in writing digital EEPROMs. Since writing the memory involves pulling the floating gate either to the supply voltage or to ground, the EEPROM cell cannot be read during the write process. Excess charge is typically added to the floating gate to compensate for this lack of memory state feedback. Although excess charge is acceptable when writing a binary valued "digital" memory, where the exact quantity of charge is irrelevant once it exceeds the amount necessary to completely switch the device to one of its two binary states, uncertainty in the amount of charge applied to an analog memory cell results in significant memory error.

Hot-electron injection is a process whereby electrons near the surface of a semiconductor acquire more than about 3.1 eV of energy, typically by acceleration in an electric field, and then surmount the silicon/oxide barrier. Once in the silicon dioxide conduction band, an electric field applied across the oxide carries these electrons to the floating gate. There are a number of ways of accomplishing hot-electron injection.

One source for a high electric field is the collector-to-base depletion region of either a vertical or lateral BJT (bipolar junction transistor). An example of a lateral BJT used in a similar application is shown in U.S. Pat. No. 4,953,928 to Anderson et al. Although this device is suitable for analog learning applications, each learning cell requires both an injection BJT and a MOSFET, the former to effect hot-electron injection and the latter to read the stored charge. A reduction in the number of transistors per cell would be highly desirable.

Another source for a high electric field is in the channel region of a split-gate N-type MOSFET. Split-gate injectors, as shown and described in U.S. Pat. No. 4,622,656 to Kamiya, et al., contain two partially overlapping gate regions at very different voltages. The resulting surface potential drops abruptly at the interface between the two gates, creating a high electric field localized in this small region of the transistor channel. Unfortunately, since the control gate modulates the injection rate but does not receive the injected charge, the memory cannot be both written and read simultaneously. Such a device is acceptable for digital EEPROMs but is unsuitable for analog learning cell applications.

A third source for high electric field is the drain to source voltage dropped across the channel region of an above-threshold sub-micron N-type MOSFET. The disadvantage of this device is that in order achieve injection, both the drain and gate voltages must exceed approximately 2.5 volts which results in high channel current and consequent high power consumption.

A fourth source for high electric field is the drain to channel depletion region formed in an N-type MOSFET. In a conventional MOSFET, as depicted in FIG. 2A–2B, this field only exists when the drain-to-source voltage exceeds 2.5 volts and the transistor is operated at or near its subthreshold regime. Since subthreshold MOSFET gate voltages are typically less than one volt, electrons injected into the gate oxide encounter a large electric field directed towards the transistor drain, opposing their transport to the floating gate. The resulting charge transfer to the floating gate is negligibly small as can be seen in the FIG. 2B energy band diagram of the transistor of FIG. 2A.

Accordingly, there is a need for an improved silicon analog memory cell which can be written and erased, which can be written and read simultaneously, and which can be realized in a single device.

SUMMARY OF THE INVENTION

The present invention is a silicon MOS transistor with a time-varying transfer function. By changing this transfer function the device can adapt to its environment; this is the essence of learning. By providing non-volatile memory storage, the device can indefinitely retain the information that it has learned, thereby providing a long term memory capability. It is useful as an analog memory cell, in systems that learn signal correlations, in systems that adapt to changing environmental stimuli, and as a silicon analogue of a biological neural synapse.

The present invention achieves a time-varying transfer function by adding and removing charge from the floating gate of an N-type MOS floating gate transistor. It has a control gate capacitively coupled to the floating gate; it is from the perspective of this control gate that the transfer function of the transistor is modified. Electrons are removed from the floating gate via Fowler-Nordheim tunneling. Electrons are added to the floating gate via hot-electron injection. The present invention achieves non-volatile memory by storing charge on the fully insulated floating gate of an N-type MOS floating gate transistor.

Fowler-Nordheim tunneling is used to remove electrons from the floating gate as follows: a tunneling junction consisting of an n+ doped active implant embedded within a lightly-doped N− substrate implant is formed at one or more edges of the floating gate and separated from the floating gate by a layer of gate oxide. A high voltage applied to this tunneling junction removes electrons from the floating gate at a rate exponential with oxide voltage. When the high voltage is removed the tunneling rate becomes negligibly small and the stored charge is retained unchanged.

Hot-electron injection is used to add electrons to the floating gate as follows: a moderately doped P-type implant is applied to the channel region of the N-type transistor during the fabrication process. This implant serves two functions. First, as compared with a conventional N-type MOSFET, this device experiences a higher electric field in the drain-to-channel depletion region. Second, the threshold voltage of the transistor is raised above 3.1 volts. The higher field in the drain-to-channel depletion region results in a larger population of hot-electrons than is seen in conventional MOSFETs. At drain voltages exceeding approximately 2.5 volts, electrons will begin being injected into the gate oxide. If the floating gate is held at a voltage greater than that of the drain, these injected electrons will be preferentially swept to the floating gate, rather than back to the drain. The moderately doped substrate implant allows the device to be operated in the low power subthreshold regime with its gate voltage higher than its drain voltage where its drain voltage exceeds about 2.5 volts. Despite the channel implant, the device remains a fully functional MOS transistor.

The hot-electron injection rate varies with the transistor drain voltage and channel current. Drain voltage is typically used to enable or disable the injection process. For drain voltages exceeding about 2.5 volts, electrons are injected onto the floating gate, decreasing the stored charge. For drain voltages less than about 2.5 volts, the injection rate is negligibly small, and the stored memory is retained unchanged.

Hence, mechanisms are provided for adding electrons to and removing electrons from the floating gate resulting in a bi-directional memory writing capability. Mechanisms are also provided by which to disable both processes, thereby retaining the stored, non-volatile analog memory. Furthermore, the device remains a fully functional N-type MOS transistor. The application of proper voltages to its drain, source and control gate terminals allows the reading of either its channel current or channel conductance, both of which are functions of its stored memory. These same terminal voltages determine whether the stored memory is being increased, decreased or held static. Therefore, simultaneous reading and writing is possible.

Accordingly, a single transistor non-volatile analog learning device is provided.

OBJECTS AND ADVANTAGES OF THE INVENTION

Accordingly, it is an object of the present invention to provide an improved analog memory cell.

It is a further object of the present invention to provide a single transistor analog memory cell.

It is a further object of the present invention to provide a memory cell capable of use in an extremely high density memory system.

It is a further object of the present invention to provide a single transistor analog memory cell that supports simultaneous memory reading and writing.

It is a further object of the present invention to provide a single transistor analog memory cell with a time-varying transfer function that is a component in the circuit used to write its own memory where the time-varying transfer function implements a learning function.

It is a further object of the present invention to provide a single transistor analog memory cell with a time-varying transfer function that is a component in the circuit used to write its own memory where the time-varying transfer function implements a learning function and the learning function defines a learning rule which can be used in the development of learning systems.

It is a further object of the present invention to provide a single transistor analog memory cell which can be simultaneously read from and written to thus supporting a feedback loop-type writing mechanism.

Yet a further object of the present invention is to provide an extremely low power, compact analog memory cell which can be incorporated into existing silicon integrated circuits and process.

These and many other objects and advantages of the present invention will become apparent to those of ordinary skill in the art from a consideration of the drawings and ensuing description of the invention.

DESCRIPTION OF THE PREFERRED EMBODIMENTS

Those of ordinary skill in the art will realize that the following description of the present invention is illustrative only and is not intended to be in any way limiting. Other embodiments of the invention will readily suggest themselves to such skilled persons from an examination of the within disclosure.

Figure 3A:
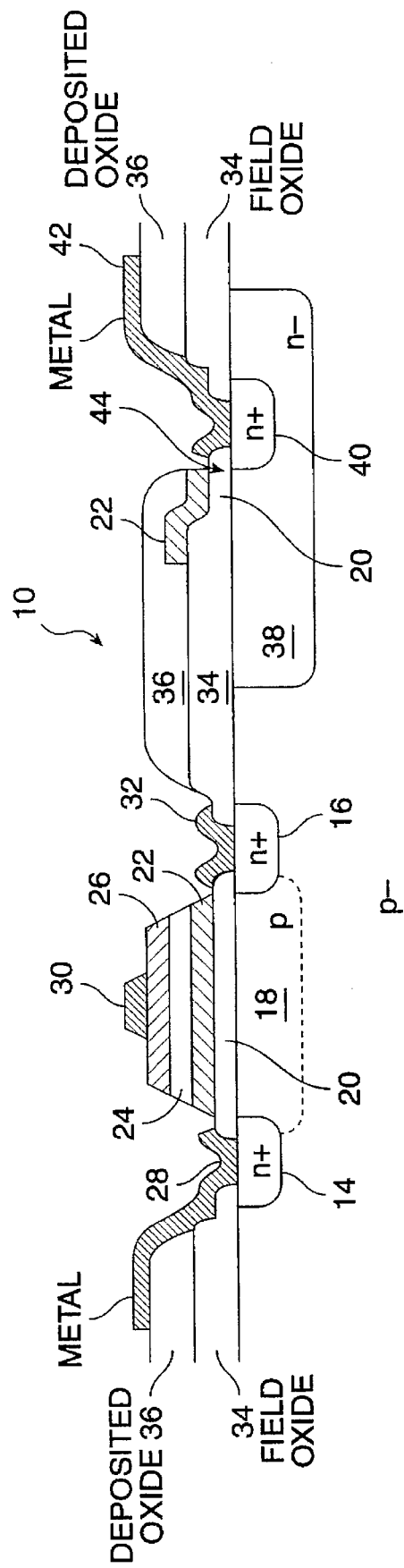
FIG. 3A is a cross-sectional diagram of an analog memory cell according to a preferred embodiment of the present invention taken along line 3A—3A of FIG. 3B.
Figure 3B:
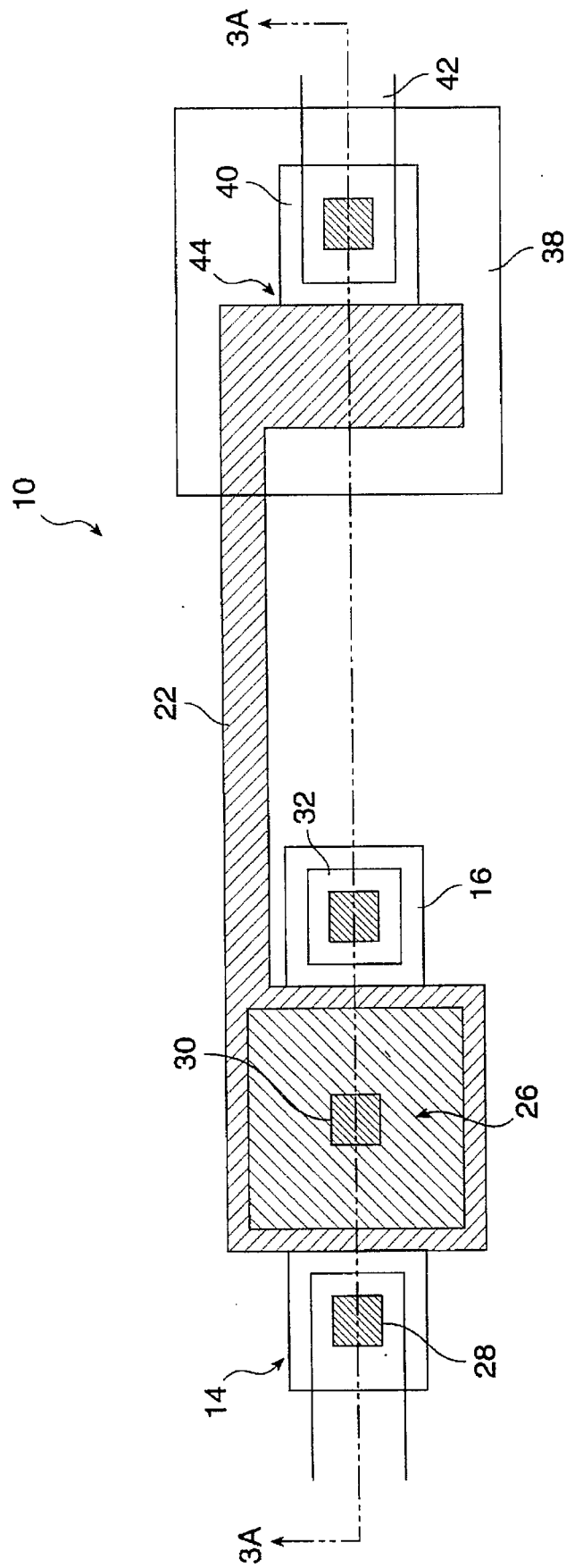
FIG. 3B is a top view of an analog memory cell according to a preferred embodiment of the present invention.

The present invention, illustrated in FIGS. 3A and 3B, is a silicon MOS structure for long term learning. It has been fabricated in an n-well, double poly, 2 µm silicon gate BiCMOS process, although other compatible process could be used as would be known to those of ordinary skill in the art.

FIG. 3B is a top view of the single transistor analog memory cell and FIG. 3A is a cross sectional view take along line 3A—3A of FIG. 3B.

Figure 1A:
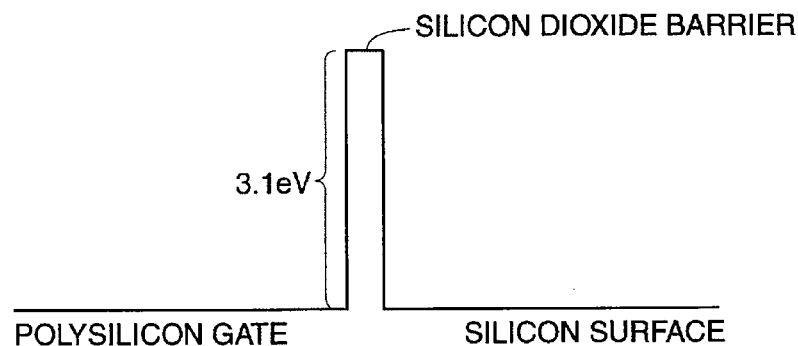
FIG. 1A is an energy band diagram showing the potential barrier faced by a conduction electron at a silicon/oxide interface.
Figure 1B:
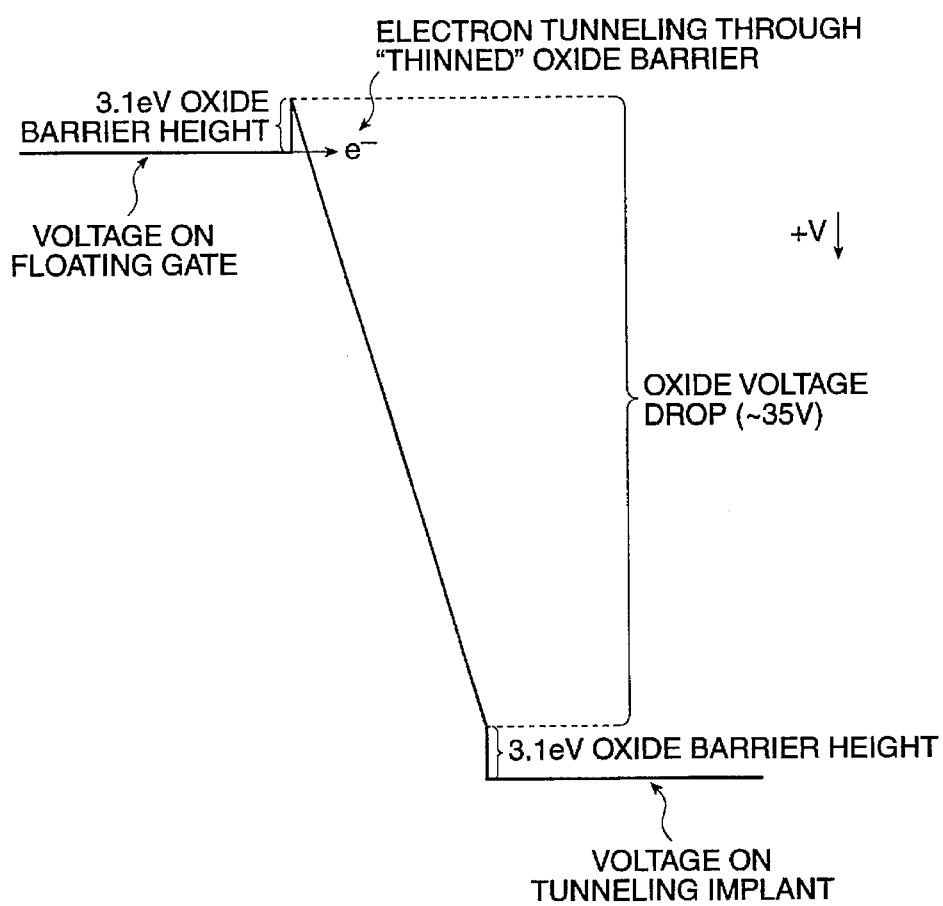
FIG. 1B is an energy band diagram showing the potential faced by an electron in silicon attempting to pass through a silicon dioxide barrier in the presence of a Fowler-Nordheim tunneling potential.
Figure 1C:
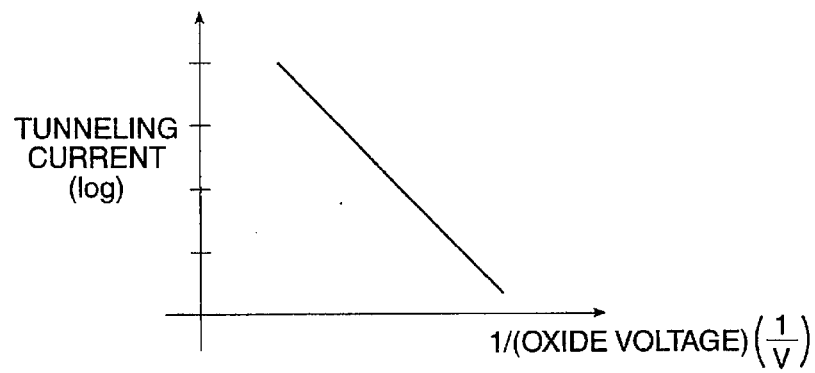
FIG. 1C is a diagram showing a semi-log plot of tunneling current vs. oxide voltage for a gate oxide tunneling junction.
Figure 2A:
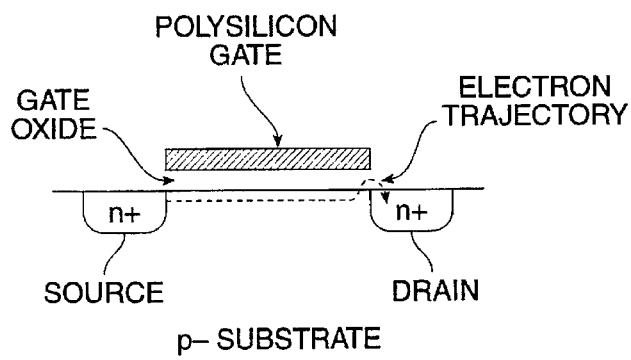
FIG. 2A is a diagram of an n-type MOSFET showing the inability to inject electrons from the channel to the gate.
Figure 2B:
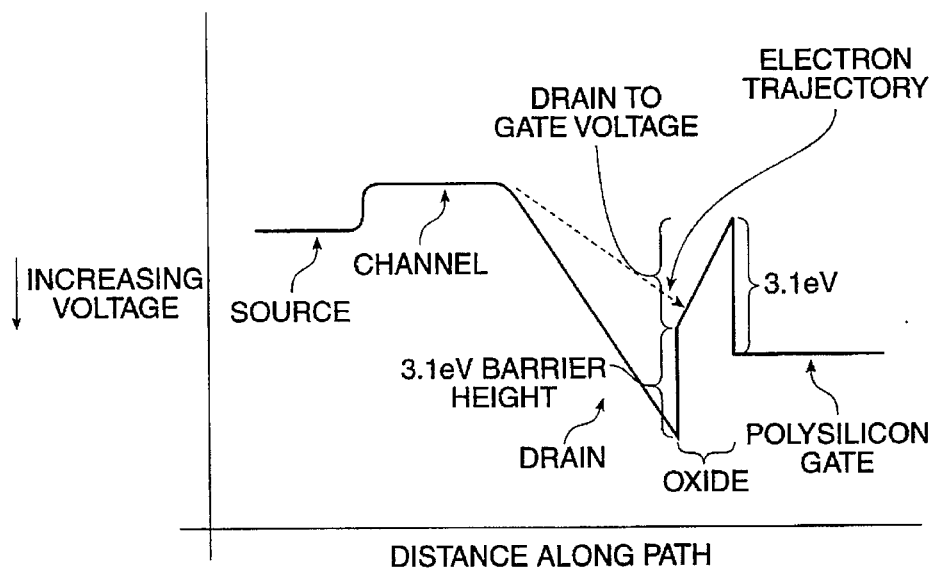
FIG. 2B is an energy band diagram of an n-type MOSFET showing the inability to inject electrons from the channel to the gate.
Figure 2C:
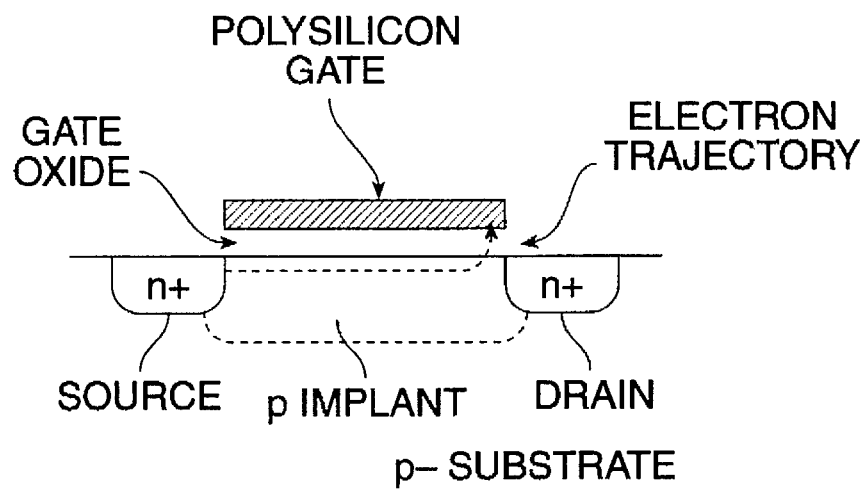
FIG. 2C is a diagram of an n-type MOSFET according to the present invention showing electron injection from the channel to the floating gate.
Figure 2D:
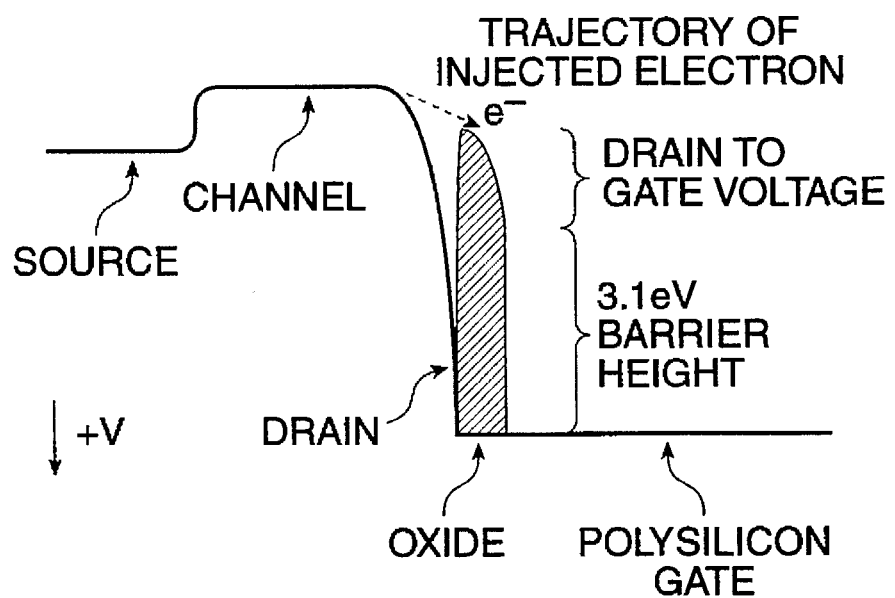
FIG. 2D is an energy band diagram showing electron injection from the channel to the floating gate of an n-type MOSFET analog memory cell according to the present invention with a p-base channel implant.
Figure 4:
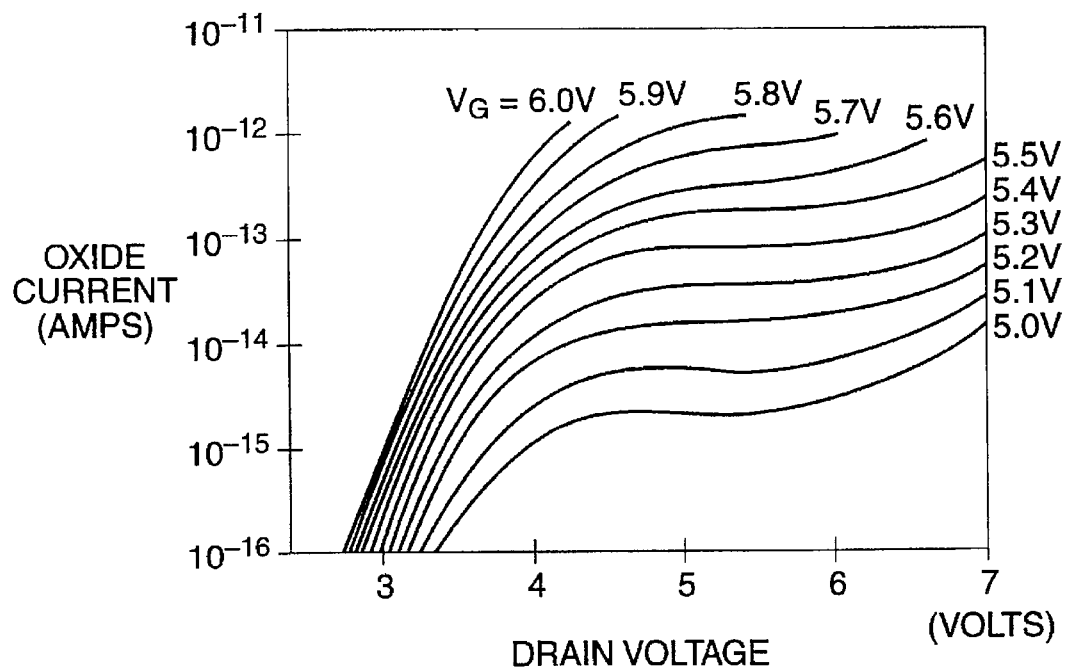
FIG. 4 is a plot of oxide current vs. drain voltage in a 4 µm long, 6 µm wide injection transistor according to a preferred embodiment of the present invention, for several values of gate voltage.

Turning to FIG. 3A, the single transistor analog memory cell 10 is fabricated on a p– type region of semiconductor substrate 12. The floating gate transistor portion of single transistor analog memory cell 10 comprises n+ doped source implant region 14 within p– region 12, n+ doped drain implant region 16 within p– region 12, moderately doped p channel implant region 18, a gate oxide layer 20, a floating gate 22, an inter-poly oxide layer 24, a control gate 26, a source contact 28, a gate contact 30, and a drain contact 32. The p– substrate 12 is preferably doped to an impurity concentration of from about 3E14/cm$^3$ to about 4E14/cm$^3$. The n+ doped source implant region 14 and n+ doped drain implant region 16 are preferably doped to a level of between about 1E19/cm$^3$ and about 1E20/cm$^3$ with 1E20/cm$^3$ presently preferred. The p channel implant region 18 is preferably doped to a moderate level using an implant such as p-base, the p type implant commonly used for the base region of a vertical bipolar transistor, with an impurity concentration in the channel of from about 1E17/cm$^3$ to about 2E17/cm$^3$ with 1E17/cm$^3$ presently preferred. This implant permits the transistor to inject hot-electrons onto floating gate 22 with the drain 16 at or above about 2.5 volts and the floating gate 22 positive relative to the drain 16. This "injection" transistor has a 6 volt threshold, allowing sub-threshold channel currents at gate voltages high enough (e.g.,+5 volts) to collect injected electrons. As indicated by the band diagram of FIG. 2D, by combining a large drain-to-channel electric field with high gate voltage in a sub-threshold transistor, the probability of injecting electrons onto the gate is greatly increased. Oxide current versus drain voltage, for several values of gate voltage, are shown in FIG. 4.

Gate oxide layer 20 is thermally grown silicon dioxide of thickness preferably equal to or less than about 400Å,. Floating gate 22 is preferably fabricated of a heavily doped conductive polysilicon, however another conductor could also be used as would be obvious to one of ordinary skill in the art. Interpoly poly oxide layer 24 is preferably equal to or less than about 750Å, and may be deposited in any convenient manner. Control gate 26 is preferably fabricated of a heavily doped conductive polysilicon, however another conductor could also be used as would be obvious to one of ordinary skill in the art. Contacts 28, 30 and 32 are preferably metal such as aluminum or another suitable conductor. The floating gate transistor portion of single transistor analog memory cell 10 is surrounded by a layer of field oxide 34 and a layer of a deposited oxide 36.

In typical use, transistor 10 has its source 14 tied to ground and its drain 16 tied to a potential which may be varied between a potential above about 2.5 volts and a potential below about 2.5 volts. The substrate 12 is at ground. A voltage applied to control gate 26 with respect to ground causes an intermediate voltage on floating gate 22.

The second portion of single transistor analog memory cell 10 comprises a tunneling junction adapted to allow removal of electrons from floating gate 22. A tunneling implant region 38 is preferably a lightly doped n− region with an impurity concentration of from about $1E16/cm^3$ to about $2E16/cm^3$ with $1E16/cm^3$ presently preferred. Within tunneling implant 38 is an n+ implant plug 40, of impurity concentration of from about $1E19/cm^3$ to about $1\ E20/cm^3$, with $1E20/cm^3$ presently preferred. This plug performs two functions. First, it allows contact 42, preferably fabricated of metal or another suitable electrical conductor, to form an electrical connection to lightly doped tunneling region 38. Second, it provides a source for tunneling electrons. Floating gate 22 extends adjacent to and, as a consequence of n+ impurity diffusion during the fabrication process, slightly over plug 40. Floating gate 22 is separated from plug 40 by a region of gate oxide 20, forming tunneling junction 44. Electron tunneling from floating gate 22, through gate oxide region 44, to plug 40, is greatly facilitated as compared with tunneling from floating gate 22, through gate oxide 20, to tunneling implant 38.

In order to remove electrons from floating gate 22, a sufficiently high voltage, e.g.,+35 volts relative to ground for a 400Å, gate oxide is applied to plug 40 via contact 42. The large positive voltage creates a favorable environment for electron tunneling from the relatively negative floating gate 22 to plug 40, removing electrons from the floating gate.

The purpose of lightly doped tunneling implant region 38 is to permit application of a high voltage to plug region 40. The use of lightly doped implants in high voltage applications in order to increase the reverse-bias breakdown voltage of pn-junctions is well known to those practiced in the art.

According to a presently preferred embodiment of the present invention, floating gate 22 fully overlies channel 18 as well as slightly overlapping source region 14 and drain region 16. This orientation is guaranteed by the selfaligning silicon MOS process typically used in the fabrication of MOS devices. According to a presently preferred embodiment of the present invention, floating gate 22 overlaps at least a portion of tunneling implant region 38.

The analog memory cell according to the present invention provides a 4-terminal single transistor device. In operation, the source 14 may be connected to ground along with the substrate 12. The drain 16 is then used to control hot-electron injection to floating gate 22. When both drain 16 and floating gate 22 are at a potential more than about+ 2.5 volts relative to ground, injection occurs and electrons will build up on floating gate 22, decreasing its voltage relative to ground. When it is desired to stop the process, dropping the potential on drain 16 to a value below about +2.5 volts relative to ground will effectively stop the hot-electron injection and the voltage on floating gate 22 will remain essentially constant.

With a gate oxide thickness of about 400Å, Fowler-Nordheim tunneling will begin when there is a potential difference of more than about 25 volts between the floating gate 22 and the plug region 40. There are at least two ways to control the tunneling mechanism. A first method is to temporarily apply a voltage of about +35 volts to plug region 40. This will yield a voltage difference of about +30 volts between floating gate 22 and plug region 40, promoting tunneling which will rapidly remove electrons from floating gate 22—raising its voltage. Alternatively, a fixed voltage of about +30 volts may be left on plug region 40, thus, in normal operation with, say +5 volts on control gate 26 and +5 volts on floating gate 22, there will be an insufficient voltage drop from plug region 40 to floating gate 22 to promote measurable tunneling, however, dropping the voltage on control gate 26 to zero (or some relatively low value) will consequently drop the voltage on floating gate 22, resulting in a larger voltage drop between plug region 40 and floating gate 22, exponentially increasing the tunneling rate and rapidly removing electrons from floating gate 22. This second implementation provides the advantage that the relatively high voltage +30 volt signal need not be carried on anything other than the metal contact lines 42 and need not be switched by the silicon integrated circuit device.

Figure 5:
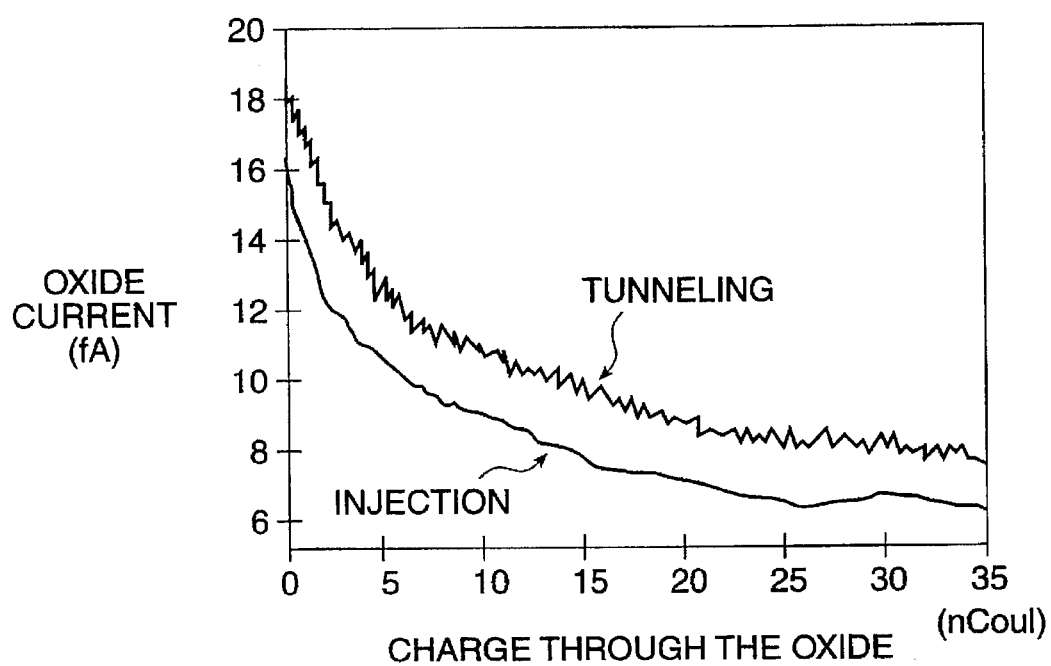
FIG. 5 is a plot of tunneling and injection rates vs. total charge transfer through the oxide for an analog memory cell according to a preferred embodiment of the present invention where the tunneling junction $V_{ox}$=29.5 volts, and the injection transistor $V_{drain}$=3.25 volts and $V_{gate}$=5.5 volts.

The present invention is a floating gate transistor where the quantity of charge stored on floating gate 22 is modified by tunneling or injecting electrons through gate insulator 20. It is well known to those practiced in the art that high-energy electron transport through an oxide insulator leads to the formation of oxide dislocations, known as traps, which act to impede further electron transport. It is also well known that oxide purity greatly affects the trap formation rate; in the chosen vendor's fabrication process, a deposited oxide, such as inter-poly oxide 24, tends to "trap up" at a much faster rate than does the ultra-pure gate oxide 20. Therefore, although the present implementation of the invention tunnels through gate oxide 20 at tunneling junction 44, rather than through inter-poly oxide 24 or through some other oxide, operation of the present invention is independent of the choice of oxide region for tunneling, with the preferred embodiment of the present invention merely indicating that gate oxide 20 is the purest available oxide in the chosen vendor's fabrication process. The electron transport rate vs. total oxide charge for the preferred embodiment of the present invention is shown in FIG. 5.

The present invention has great potential for integrated circuit applications which require storing an analog voltage, learning signal correlations, or adapting to circuit and signal conditions. Two examples of such applications are discussed herein. These examples are intended merely to illustrate usage of the device, and not in any way to limit its many potential applications.

The first example is an analog memory cell. In the past, achieving high resolution non-volatile analog parameter storage has been hampered by the lack of a suitable storage element. Typical implementations store an m-bit digital word in m binary values memory cells, where m usually ranges from 8 to 16, and generate an analog output using a digital-to-analog converter (DAC). This approach typically requires between 25 and 200 transistors. Achieving equivalent resolution in a compact analog memory cell requires non-volatile storage, a mechanism for analog readout, and careful control of the memory writing process.

The present invention readily supports all the requirements for an analog memory cell. Non-volatile storage is achieved by storing charge on the fully insulated gate of a floating gate transistor. Analog readout, in this example, is achieved by measuring the analog-valued floating gate voltage. To those practiced in the art, careful control of the write process typically implies using a feedback loop to control the memory writing. Since the present invention supports simultaneous memory reading and writing, it allows such closed loop control of the write process.

Figure 6:
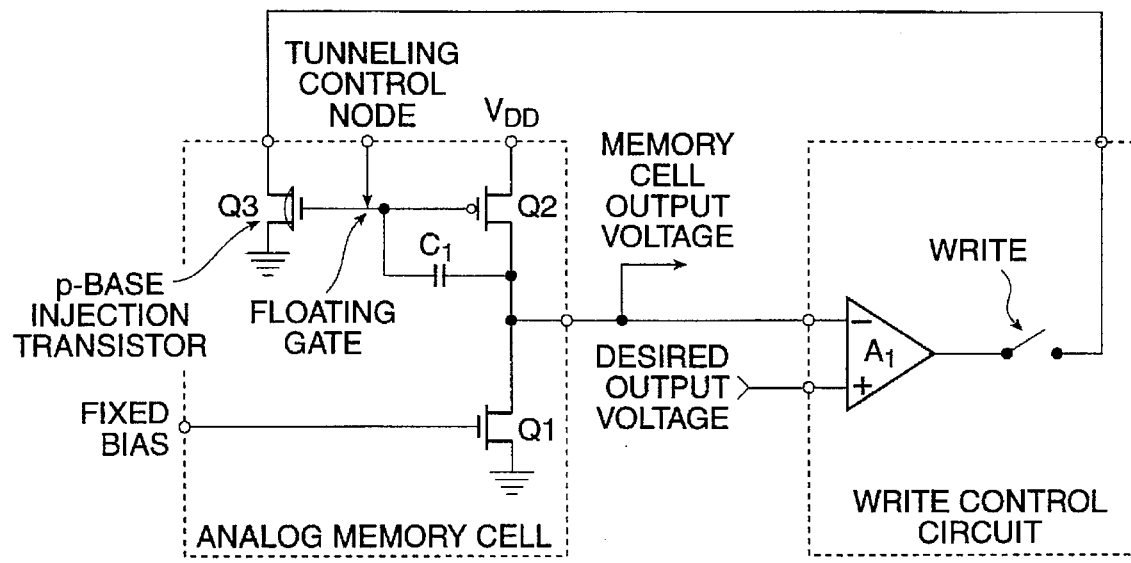
FIG. 6 is a diagram of a buffered voltage output analog memory incorporating a preferred embodiment of the present invention together with exemplary control circuitry.

FIG. 6 shows the example analog memory cell, together with a feedback control loop for memory writing. Transistor Q1 is used for biasing. The inverting amplifier formed by Q1 and Q2 drives the output node. Using subthreshold channel currents in this amplifier permits rail-to-rail output voltages and a power consumption measured in nW. Q3 is the present invention, and capacitor Ci represents the present invention's floating gate, preferably enlarged as increased capacitance enhances memory resolution.

The feedback controlled write mechanism is preferably operated as follows:

1. The cell is erased before writing. A positive high voltage applied to the tunneling control node ($V_{tun}$) removes electrons from the floating gate, causing the memory cell output voltage ($V_{out}$) to approach ground. $V_{tun}$ is then brought low, disabling the tunneling.

2. The desired output voltage ($V_{in}$) is applied to the non-inverting input of comparator $A_1$. Enabling the comparator output sets the drain of injection transistor Q3 high, causing electrons to be injected onto the floating gate. Electron injection causes $V_{out}$ to slew upwards, at a rate set approximately by:

$$\frac{dV_{out}}{dt} = \frac{I_{inj}}{C_i}$$

3. Once $V_{out}$ exceeds $V_{in}$, the comparator $A_1$ lowers Q3's drain voltage to ground, leaving $V_{out}=V_{in}$. Disabling the comparator output preserves $V_{out}$ at the desired value.

An analog memory cell fabricated as in FIG. 6 and operated as discussed herein has demonstrated analog parameter storage with 15 bits effective resolution.

The second example uses the present invention as a single transistor silicon synapse. The implied analogy with biological synapses arises from the following shared attributes:

1) Long term non-volatile analog memory storage;

2) Memory plasticity, where plasticity is defined as an ability to modify the stored memory with time;

3) Implicit computation of the feedforward product of an input with the stored memory;

4) Implicit updates of the stored memory according to a Hebbian learning rule; and 5) Minimum device size and minimum power consumption within the available fabrication medium (carbon-based biological substrate or silicon based VLSI circuit substrate).

Figure 7:
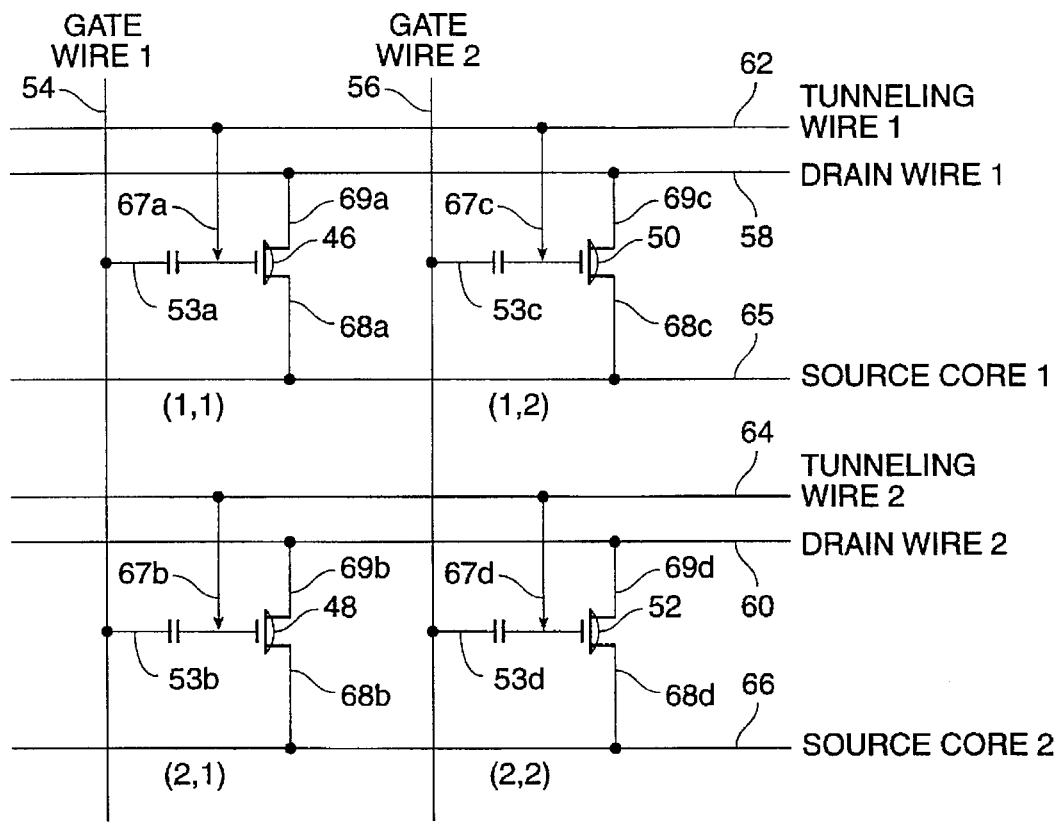
FIG. 7 is a diagram of an array-type analog memory system according to a preferred embodiment of the present invention.

FIG. 7 shows one of many possible array implementations using the present invention; the four transistors 46 (1,1), 48 (2,1), 50 (1,2) and 52 (2,2) shown in FIG. 7 represent a small subset of a potentially much larger array structure. Each of these transistors is a silicon synapse, where synaptic strength (synaptic weight) is represented by charge stored on its floating gate. Each transistor has its floating gate capacitively coupled to a gate wire (54, 56). These array inputs connect to the second-level polysilicon gates (53a, 53b, 53c, 53d) of the transistors, with each individual input shared among all the gates in a particular column of the array. The array outputs connect to the sources and drains of the synapse transistors, with each individual output shared among all the synapses in a particular row of the array by connection to source wires (65, 66) and drain wires (58, 60). The feedback error signals connect to the tunneling nodes (67a, 67b, 67c, 67d), source terminals (68a, 68b, 68c, 68d), and drain terminals (69a, 69b, 69c, 69d) of the synapse transistors, with each individual signal shared among all the device terminals in a particular row of the array.

Each synapse individually computes the sum of its column input signal and its stored weight value, generating as its output a channel conductance whose value is derived from the computation. This conductance is translated to a channel current by the imposition of a potential difference between the row drain and source terminals of said synapse. The sum of channel currents along a row is an array output. All synapses operate in parallel, performing their computations simultaneously in time.

Each synapse individually computes updates to its stored weight value. The tunneling current for each synapse derives from the potential difference between the row tunneling voltage and the synapse floating gate voltage. The injection current for each synapse derives from the synapse drain voltage and channel current. The sum of these two oxide currents determines the net change in floating gate voltage. All synapses operate in parallel, computing their memory updates simultaneously in time. The particular learning algorithm employed by the array derives from the circuitry at the array boundaries; in particular, the circuitry connected to each of the tunneling nodes, source terminals, and drain terminals.

Figure 8:
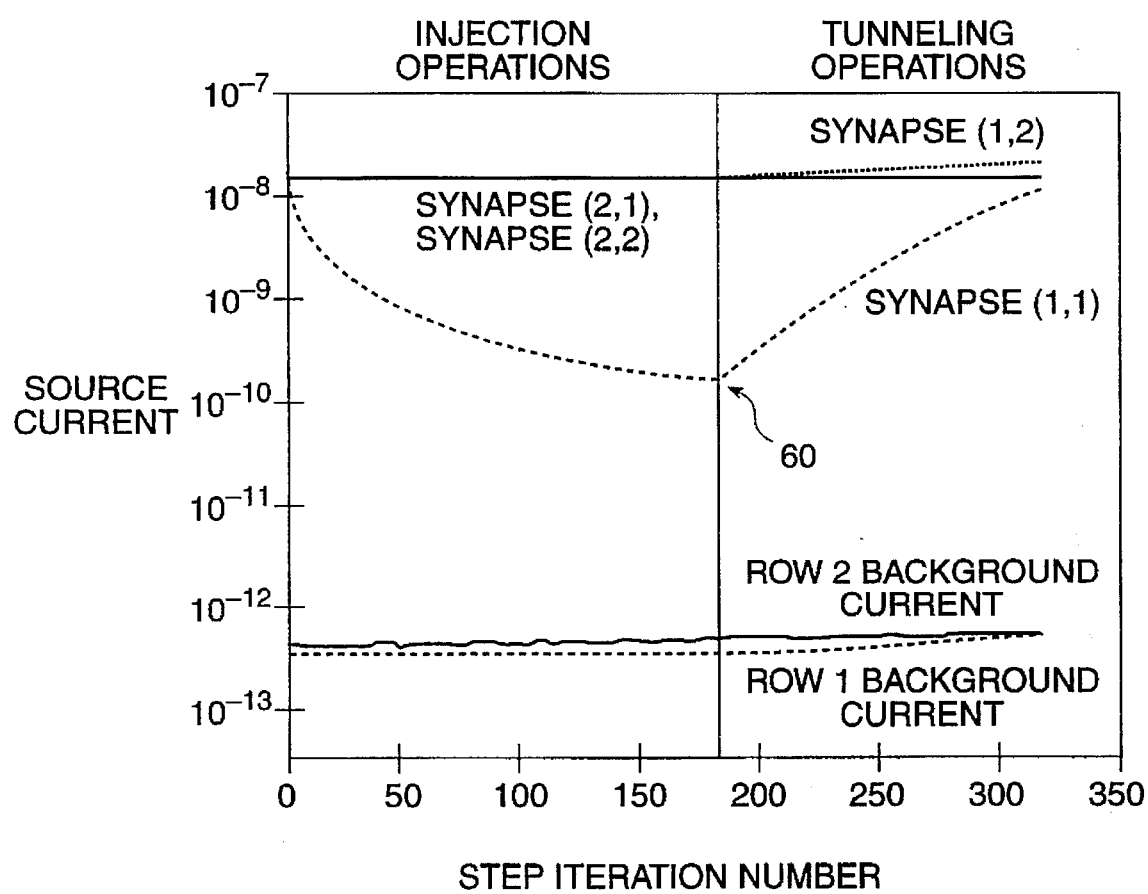
FIG. 8 is a plot of output currents from a 2×2 section of a synaptic array, showing unlearning and learning at a single selected synapse.
Figure 3A:
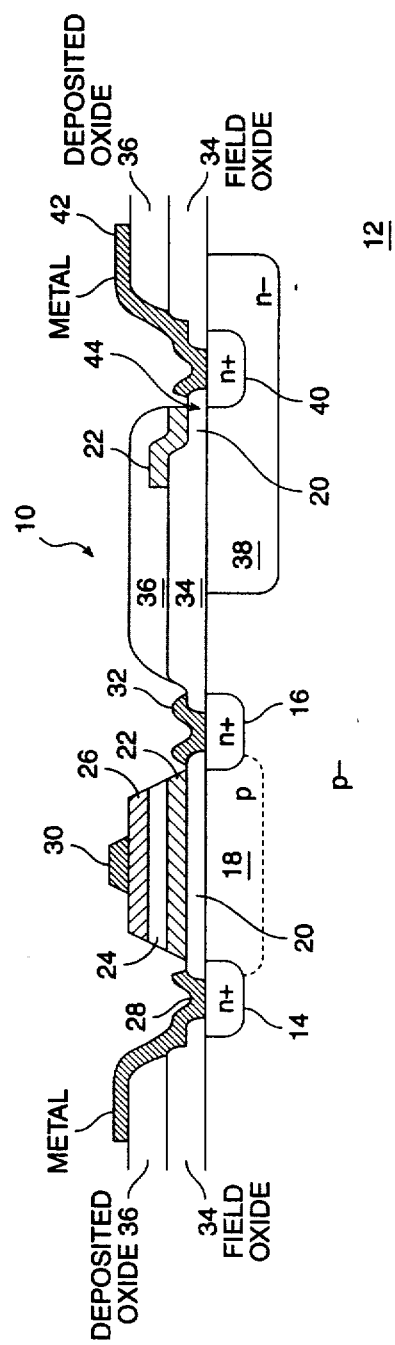
Figure 6:
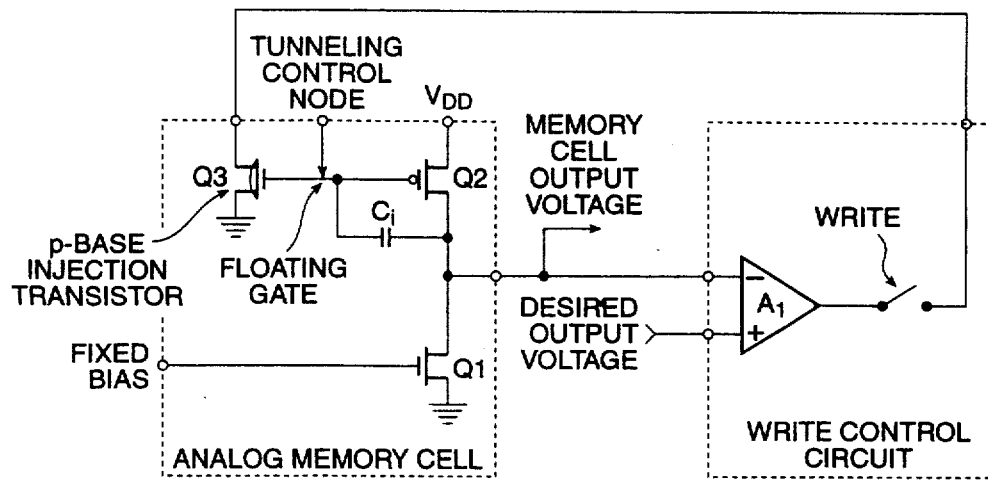
Figure 7:
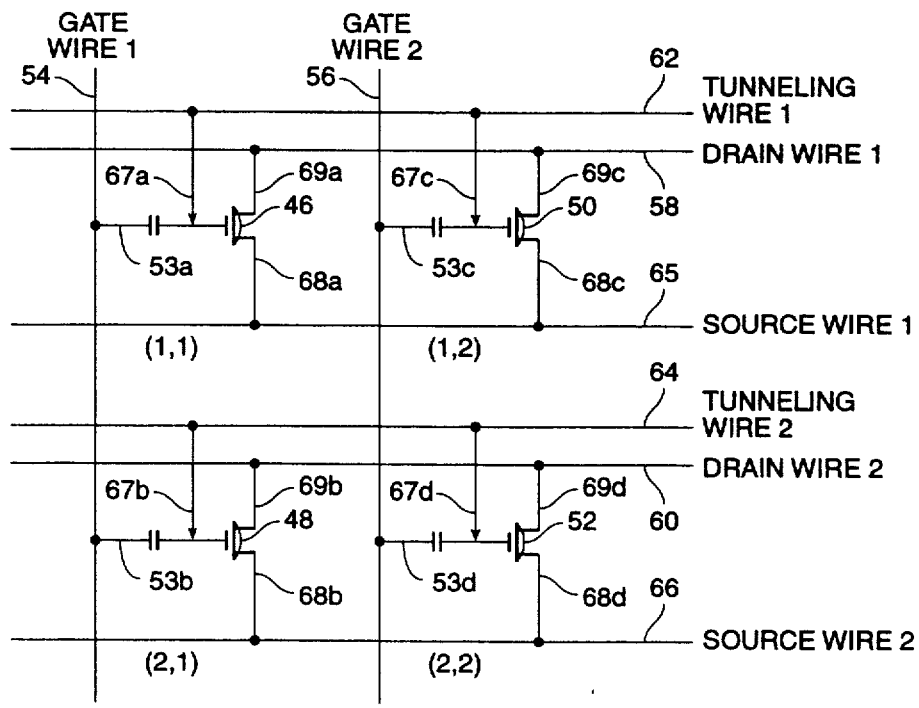

FIG. 8 shows the output currents from a 2×2 section of the synapse array as shown in FIG. 7. Here 180 injection operations were followed by 160 tunneling operations. For the injection operations, the drain wire 1 (58) was pulsed from 2.0 V up to 3.3 V for 0.5 seconds with gate wire 1 (54) at 8 V and gate wire 2 (56) at 0 V. For the tunneling operations, tunneling wire 1 (62) was pulsed from 20 V up to 33.5 V with gate wire 2 (56) at 0 V and gate wire 1 (54) at 8 V. Because the measurements from the 2×2 section come from a larger array, the "background" current from all other synapses on the row is diagrammed as well. This background current is several orders of magnitude smaller than the selected synapse current, and therefore negligible. FIG. 8 shows an example of the nature of the weight update process. Source current is used as a measure of the synapse weight. The experiment starts with all four synapses set to the same source current. First, synapse 46 (1,1) is activated by raising the voltage on both column 54 and row 58. Synapse 46 experiences hot electron injection, which preferentially decreases its weight value. At position 60 in FIG. 8, synapse 46 is deactivated by decreasing the voltage on both column 54 and row 56. Also at position 60, synapse 50 is activated by raising the voltage on column 56, and tunneling is activated by raising the voltage on row 62. Synapse 46 (1,1) experiences electron tunneling, which preferentially increases its weight value. This experiment shows that synapse 46 can preferentially learn by raising the voltage on row 62 and decreasing the voltage on column 54, and can preferentially unlearn by raising the voltages on both column 54 and row 58.

It should be readily apparent to those practiced in the art that by placing appropriate circuitry at the ends of the row/column wires, it is possible to implement a Hebbian learning rule in an array of single transistor synapses, a backpropagation of errors learning rule in an array of single transistor synapses, and many other similar neural network learning rules in an array of single transistor synapses. It will be further apparent that an array such as that of FIG. 7 simultaneously performs analog computation and learning for all synapses in parallel, and as such can implement powerful computational and learning functions. It will be further apparent that the array of FIG. 7 is only one of many potential array configurations, each with its own computational advantages, and the example of FIG. 7 is not intended to limit in any way the potential applications of the present invention.

The present invention will facilitate the development of neural network integrated circuits. Since each cell requires only a single transistor, these networks can be made quite large. The moderately doped channel implant promotes operating these devices in the subthreshold (low inversion) MOS regime; the resulting power consumption is typically only 50 nW per cell. Finally, since the present invention uses conventional BiCMOS fabrication techniques, such networks can be built today using existing commercial IC foundries and available processes.

Typical voltages used to control the device are as follows:

A first positive potential is applied to the drain region with respect to the p– substrate to reverse bias the drain region with respect to the p– substrate. The first positive potential has a magnitude of greater than about +2.5 volts relative to the substrate, but less than the voltage required to induce avalanche breakdown in the junction formed between the drain and the substrate;

A second positive potential is capacitively coupled to the floating gate. The second positive potential has a magnitude of greater than about +2.5 volts relative to the substrate;

A third potential is applied to the source region with respect to the substrate. The third potential is in the range of about zero to about +2.0 volts relative to the substrate; and A fourth potential is selectively applied to the tunneling junction (contact 42 in the first embodiment described above). The fourth potential is positive with respect to the floating gate and it is selected to be high enough to induce the desired tunneling within a desired amount of time. In the embodiment described above, the fourth potential may be approximately +35 volts relative to the substrate.

Figure 3C:
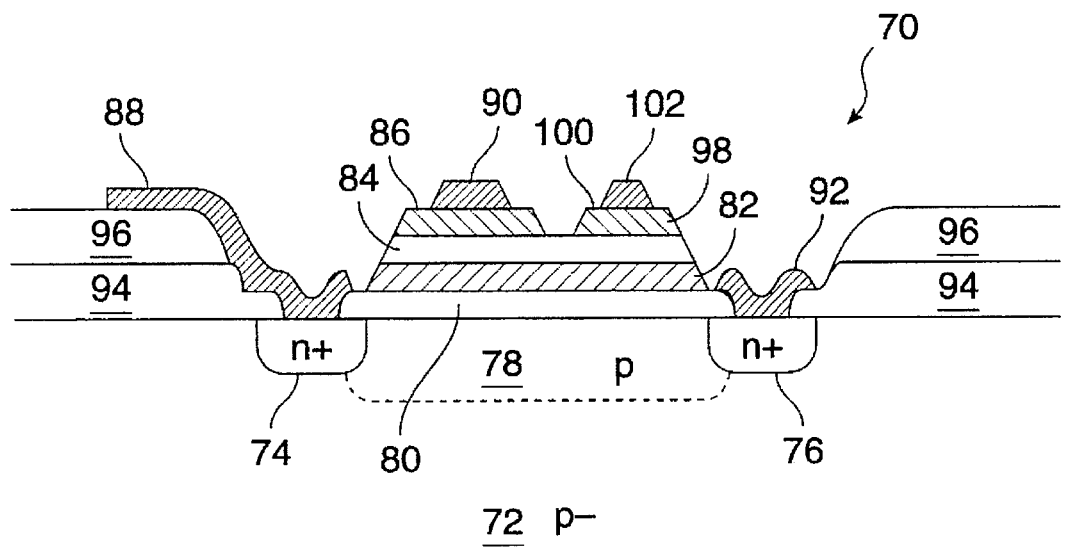
FIG. 3C is a cross-sectional diagram of an analog memory cell according to an alternate embodiment of the present invention taken along line 3C—3C of FIG. 3D.
Figure 3D:
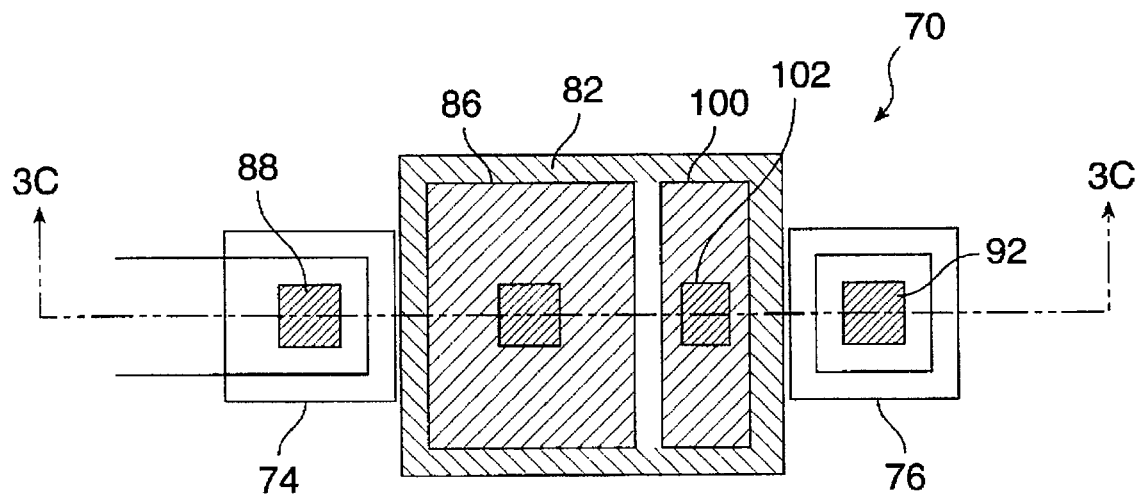
FIG. 3D is a top view of an analog memory cell according to an alternate embodiment of the present invention.

An alternative embodiment of the present invention is shown in FIGS. 3C and 3D. FIG. 3C is a top view of an alternative embodiment of the single transistor analog memory cell and FIG. 3D is a cross-sectional view take along line 3C—3C of FIG. 3D.

Turning to FIG. 3C, the single transistor analog memory cell 70 is fabricated much the same as single transistor analog memory cell 10, on a p– type region of semiconductor substrate 72. The floating gate transistor portion of single transistor analog memory cell 70 comprises n+ doped source implant region 74 within p– region 72, n+ doped drain implant region 76 within p– region 72, moderately doped p channel implant region 78, a gate oxide layer 80, a floating gate 82, an inter-poly oxide layer 84, a control gate 86, a source contact 88, a gate contact 90, and a drain contact 92. The p– substrate 72 is preferably doped to an impurity concentration of from about 3E14/cm³ to about 4E14/cm³. The n+ doped source implant region 74 and n+ doped drain implant region 76 are preferably doped to a level of between about 1E19/cm³ and about 1E20/cm³ with 1E20/cm³ presently preferred. The p channel implant region 78 is preferably doped to a moderate level using an implant such as p-base, the p type implant commonly used for the base region of a vertical bipolar transistor, with an impurity concentration in the channel of from about 1E17/cm³ to about 2E17/cm³ with 1E17/cm³ presently preferred. The voltage parameters set forth in the FIG. 3A embodiment are the same here.

Gate oxide layer 80 is preferably thermally grown silicon dioxide of thickness preferably equal to or less than about 400Å. Floating gate 82 is preferably fabricated of a heavily doped conductive polysilicon, however another conductor could also be used as would be obvious to one of ordinary skill in the art. Inter-poly oxide layer 84 is preferably equal to or less than about 750Å and may be deposited in any convenient manner. Control gate 86 is preferably fabricated of a heavily doped conductive polysilicon, however another conductor could also be used as would be obvious to one of ordinary skill in the art. Contacts 88, 90 and 92 are preferably metal such as aluminum or another suitable conductor. The floating gate transistor portion of single transistor analog memory cell 70 is surrounded by a layer of field oxide 94 and a layer of a deposited oxide 96.

In typical use, transistor 70 has its source 74 tied to ground and its drain 76 tied to a potential which may be varied between a potential above about 2.5 volts and a potential below about 2.5 volts. The substrate 72 is at ground. A voltage applied to control gate 86 with respect to ground causes an intermediate voltage on floating gate 82.

The second portion of single transistor analog memory cell 70 comprises a tunneling junction 98 adapted to allow removal of electrons from floating gate 82. Pursuant to this alternative embodiment, at some sacrifice in performance, a significant reduction in size is achieved by replacing tunneling implant region 38 from the FIG. 3A embodiment with a tunneling junction located between the first and second poly layers and comprising floating gate 82, interpoly oxide layer 84 (which may be any suitable depositable insulator), second poly layer 100 (separate from but preferably of the same material (preferably polysilicon) as control gate 86), and second poly contact 102 which is preferably the same as contact 90.

Tunneling junction 98 operates in a similar fashion to the tunneling junction described in the previously described embodiment, except that the high voltage is not applied to a separate implant within substrate 12. When contact 102 is brought to a relatively high positive voltage potential, electrons on floating gate 82 will tend to tunnel across interpoly oxide layer 84 to second poly layer 100 and then are conducted to second poly contact 102. The tunneling takes place across deposited oxide layer 84 rather than across a gate oxide and, accordingly, may result in a device exhibiting poorer performance than where a purer gate oxide is utilized. However, extra care may be used in the formation of the deposited oxide, or, the device may be suitable without such modification for many applications not requiring the ultimate in performance provided by use of a gate oxide in the tunneling junction.

Typical voltages used to control this alternative device are as follows:

A first positive potential is applied to the drain region with respect to the p– substrate to reverse bias the drain region with respect to the p– substrate. The first positive potential has a magnitude of greater than about +2.5 volts relative to the substrate, but less than the voltage required to induce avalanche breakdown in the junction formed between the drain and the substrate;

A second positive potential is capacitively coupled to the floating gate. The second positive potential has a magnitude of greater than about +2.5 volts relative to the substrate;

A third potential is applied to the source region with respect to the substrate. The third potential is in the range of about zero to about +2.0 volts relative to the substrate; and A fourth potential is selectively applied to the tunneling junction (contact 102 in the second embodiment described above). The fourth potential is positive with respect to the floating gate and it s selected to be high enough to induce the desired tunneling within a desired amount of time. In the embodiment described above, the fourth potential may be approximately +20 volts relative to the substrate.

While illustrative embodiments and applications of this invention have been shown and described, it would be apparent to those skilled in the art that many more modifications than have been mentioned above are possible without departing from the inventive concepts set forth herein. The invention, therefore, is not to be limited except in the spirit of the appended claims.

What is claimed is:

1. A semiconductor structure for long term learning comprising:

a p− type region in a semiconductor substrate;

a first n+ type region disposed in said p− type region;

a second n+ type region disposed in said p− type region;

an n− type region disposed in said p− type region, said n− type region including an n+ doped region surrounded by said n− type region within said p− type region;

a channel disposed between said first n+ type region and said second n+ type region, said channel additionally p doped to an impurity level in the range of about $1E17/cm^3$ to about $2E17/cm^3$;

a floating gate disposed over said channel and separated from said channel by an insulator, a portion of said floating gate also disposed over said n− type region;

an insulating layer disposed over said floating gate;

a conductive region disposed over said insulating layer and capacitively coupled to said floating gate;

means for applying a first positive potential to said second n+ type region with respect to said p− type region to reverse bias said second n+ type region with respect to said p− type region, said first positive potential having a magnitude of greater than about +2.5 volts relative to said p− type region, but less than the voltage required to induce avalanche breakdown in a junction formed between said second n+ type region and said p− type region;

means for capacitively coupling a second positive potential to said floating gate, said second positive potential having a magnitude of greater than about +2.5 volts relative to said p− type region;

means for applying a third potential to said first n+ type region with respect to said p− type region, said third potential in the range of about zero to about +2.0 volts relative to said p− type region; and means for selectively applying a fourth potential to said n− type region, said fourth potential being positive with respect to said floating gate.

2. The semiconductor structure according to claim 1 wherein said means for capacitively coupling a second positive potential to said floating gate comprises a conductor coupled to said floating gate by a first capacitance.

3. The semiconductor structure according to claim 1 wherein said insulator is a layer of gate oxide.

4. A semiconductor structure for long term learning comprising:

a p− type region in a semiconductor substrate;

a first n+ type region disposed in said p− type region;

a second n+ type region disposed in said p− type region;

an n− type region disposed in said p− type region, said n− type region including an n+ doped region surrounded by said n− type region within said p− type region;

a channel disposed between said first n+ type region and said second n+ type region, said channel including a region additionally p-doped to an impurity level in the range of about $1E17/cm^3$ to about $2E17/cm^3$;

a floating gate disposed both above said channel and above a portion of said n− type region and separated from said channel and said portion of said n− type region by an insulator;

an insulating layer disposed over said floating gate;

a conductive region disposed over said insulating layer and capacitively coupled to said floating gate;

means for applying a first positive potential to said second n+ type region with respect to said p− type region to reverse bias said second n+ type region with respect to said p− type region, said first positive potential having a magnitude of greater than about +2.5 volts relative to said p− type region, but less than the voltage required to induce avalanche breakdown in a junction formed between said second n+ type region and said p− type region;

means for capacitively coupling a second positive potential to said floating gate, said second positive potential having a magnitude of greater than about +2.5 volts relative to said p− type region;

means for applying a third potential to said first n+ type region with respect to said p− type region, said third potential in the range of about zero to about +2.0 volts relative to said p− type region; and means for selectively applying a fourth potential to said n− type region, said fourth potential being positive with respect to said floating gate.

5. The semiconductor structure according to claim 4 wherein said means for capacitively coupling a second positive potential to said floating gate comprises a conductor coupled to said floating gate by a first capacitance.

6. The semiconductor structure according to claim 4 wherein said insulator is a layer of gate oxide.

7. A semiconductor structure for long term learning comprising:

a p− type region in a semiconductor substrate;

an n+ type source region disposed in said p− type region;

an n+ type drain region disposed in said p− type region;

an n− type tunneling junction region disposed in said p− type region, said n− type tunneling junction region including an n+ doped plug region surrounded by a lightly doped n− region within said p− type region;

a channel disposed between said source region and said drain region, said channel including an additionally p doped region having an impurity level in the range of about $1E17/cm^3$ to about $2E17/cm^3$;

a floating gate disposed over said channel and over said n− type tunneling junction region, said floating gate disposed adjacent to at least one edge of each of said drain region, said source region and said n+ doped plug region, and separated from said semiconductor substrate by a gate oxide under a portion of said floating gate including at least where it is adjacent to an edge of each of said drain region, said source region and said n+ doped plug region;

an insulating layer disposed over said floating gate;

a conductive region disposed over said insulating layer and capacity coupled to said floating gate;

means for applying a first positive potential to said drain region with respect to said p− type region to reverse bias said drain region with respect to said p− type region, said first positive potential having a magnitude of greater than about +2.5 volts relative to said p− type region, but less than the voltage required to induce avalanche breakdown in a junction formed between said drain region and said p– type region;

means for capacity coupling a second positive potential to said floating gate, said second positive potential having a magnitude of greater than about +2.5 volts relative to said p– type region;

means for applying a third potential to said source region with respect to said p– type region, said third potential in the range of about zero to about +2.0 volts relative to said p– type region; and means for selectively applying a fourth potential to said tunneling junction region, said fourth potential being positive with respect to said floating gate.

8. The semiconductor structure according to claim 7 wherein said means for capacitively coupling a second positive potential to said floating gate comprises a conductor coupled to said floating gate by a first capacitance.

9. An analog memory cell comprising:

a semiconductor substrate including a p– type region;

a first n+ type region disposed in said p– type region;

a second n+ type region disposed in said p– type region;

an n– type region disposed in said p– type region, said n– type region including an n+ doped region disposed at a surface of said semiconductor substrate and surrounded by said n– type region;

a channel disposed between said first n+ type region and said second n+ type region, said channel additionally p doped to an impurity level in the range of about $1E17/cm^3$ to about $2E17/cm^3$;

a floating gate disposed above both said channel and said n– type region and separated from said channel and from said n– type region by a layer of gate oxide;

an insulating layer disposed over said floating gate;

a conductive region disposed over said insulating layer and capacitively coupled to said floating gate;

means for applying a first positive potential to said second n+ type region with respect to said p– type region to reverse bias said second n+ type region with respect to said p– type region, said first positive potential having a magnitude of greater than about +2.5 volts relative to said p– type region, but less than the voltage required to induce avalanche breakdown in a junction formed between said second n+ type region and said p– type region;

means for capacitively coupling a second positive potential to said floating gate, said second positive potential having a magnitude of greater than about +2.5 volts relative to said p– type region;

means for applying a third potential to said first n+ type region with respect to said p– type region, said third potential in the range of about zero to about +2.0 volts relative to said p– type region; and means for selectively applying a fourth potential to said n– type region, said fourth potential being positive with respect to said floating gate.

10. An analog memory cell comprising:

a semiconductor substrate including a p– type region;

a first n+ type region disposed in said p– type region;

a second n+ type region disposed in said p– type region;

an n– type region disposed in said p– type region, said n– type region including an n+ doped region disposed at a surface of said semiconductor substrate and surrounded by said n– type region;

a channel disposed between said first n+ type region and said second n+ type region, said channel additionally p doped to an impurity level in the range of about $1E17/cm^3$ to about $2E17/cm^3$;

a floating gate disposed above both said channel and said n– type region and extending over said n+ doped region and separated from said channel and from said n– type region and said n+ doped region by a layer of gate oxide;

an insulating layer disposed over said floating gate;

a conductive region disposed over said insulating layer and capacitively coupled to said floating gate;

means for applying a first positive potential to said second n+ type region with respect to said p– type region to reverse bias said second n+ type region with respect to said p– type region, said first positive potential having a magnitude of greater than about +2.5 volts relative to said p– type region, but less than the voltage required to induce avalanche breakdown in a junction formed between said second n+ type region and said p– type region;

means for capacitively coupling a second positive potential to said floating gate, said second positive potential having a magnitude of greater than about +2.5 volts relative to said p– type region;

means for applying a third potential to said first n+ type region with respect to said p– type region, said third potential in the range of about zero to about +2.0 volts relative to said p– type region; and means for selectively applying a fourth potential to said n– type region, said fourth potential being positive with respect to said floating gate.

11. An analog memory cell comprising:

a semiconductor substrate including a p– type region;

a first n+ type region disposed in said p– type region;

a second n+ type region disposed in said p– type region;

an n– type region disposed in said p– type region, said n– type region including an n+ doped region disposed at a surface of said semiconductor substrate and surrounded by said n– type region;

a channel disposed between said first n+ type region and said second n+ type region, said channel additionally p doped to an impurity level in the range of about $1E17/cm^3$ to about $2E17/cm^3$;

a floating gate disposed above both said channel and said n– type region and separated from said channel and from said n– type region and said first and second n+ doped regions by a layer of gate oxide, said floating gate extending over a portion of said first n+ type region and said second n+ type region;

an insulating layer disposed over said floating gate;

a conductive region disposed over said insulating layer and capacitively coupled to said floating gate;

means for applying a first positive potential to said second n+ type region with respect to said p– type region to reverse bias said second n+ type region with respect to said p– type region, said first positive potential having a magnitude of greater than about +2.5 volts relative to said p– type region, but less than the voltage required to induce avalanche breakdown in a junction formed between said second n+ type region and said p– type region;

means for capacitively coupling a second positive potential to said floating gate, said second positive potential having a magnitude of greater than about +2.5 volts relative to said p– type region;

means for applying a third potential to said first n+ type region with respect to said p– type region, said third potential in the range of about zero to about +2.0 volts relative to said p– type region; and means for selectively applying a fourth potential to said n– type region, said fourth potential being positive with respect to said floating gate.

12. A semiconductor structure for long term learning comprising:

a p– type region in a semiconductor substrate;

a first n+ type source region disposed in said p– type region;

a second n+ type drain region disposed in said p– type region;

a channel disposed between said first n+ type source region and said second n+ type drain region, said channel additionally p doped to an impurity level in the range of about 1E17/cm$^3$ to about 2E17/cm$^3$;

a floating gate disposed over said channel and separated from said channel by an insulator;

an insulating layer disposed over said floating gate;

a first conductive region disposed over said insulating layer and capacitively coupled to said floating gate;

a tunneling junction disposed between said floating gate and a second conductive region;

means for applying a first positive potential to said second n+ type region with respect to said p– type region to reverse bias said second n+ type region with respect to said p– type region, said first positive potential having a magnitude of greater than about +2.5 volts relative to said p– type region, but less than the voltage required to induce avalanche breakdown in a junction formed between said second n+ type region and said p– type region;

means for capacitively coupling a second positive potential to said floating gate, said second positive potential having a magnitude of greater than about +2.5 volts relative to said p– type region;

means for applying a third potential to said first n+ type region with respect to said p– type region, said third potential in the range of about zero to about +2.0 volts relative to said p– type region; and means for selectively applying a fourth potential to said second conductive region, said fourth potential being positive with respect to said floating gate.

13. A semiconductor structure for long term learning comprising:

a p– type region in a semiconductor substrate;

a first n+ type region disposed in said p– type region;

a second n+ type region disposed in said p– type region;

a channel disposed between said first n+ type region and said second n+ type region, said channel including a region additionally p-doped to an impurity level in the range of about 1E17/cm$^3$ to about 2E17/cm$^3$;

a floating gate disposed above said channel and separated from said channel by an insulator;

an insulating layer disposed over said floating gate;

a first conductive region disposed over said insulating layer and capacitively coupled to said floating gate;

a tunneling junction disposed between said floating gate and a second conductive region, said tunneling junction including a portion of said insulating layer;

means for applying a first positive potential to said second n+ type region with respect to said p– type region to reverse bias said second n+ type region with respect to said p– type region, said first positive potential having a magnitude of greater than about +2.5 volts relative to said p– type region, but less than the voltage required to induce avalanche breakdown in a junction formed between said second n+ type region and said p– type region;

means for capacitively coupling a second positive potential to said floating gate, said second positive potential having a magnitude of greater than about +2.5 volts relative to said p– type region;

means for applying a third potential to said first n+ type region with respect to said p– type region, said third potential in the range of about zero to about +2.0 volts relative to said p– type region; and means for selectively applying a fourth potential to said second conductive region, said fourth potential being positive with respect to said floating gate.

14. A semiconductor structure for long term learning comprising:

a p– type region in a semiconductor substrate;

an n+ type source region disposed in said p– type region;

an n+ type drain region disposed in said p– type region;

a channel disposed between said source region and said drain region, said channel including an additionally p doped region having an impurity level in the range of about 1E17/cm$^3$ to about 2E17/cm$^3$;

a floating gate disposed over said channel, said floating gate disposed adjacent to at least one edge of each of said drain region and said source region and separated from said semiconductor substrate by a gate oxide under a portion of said floating gate including at least where it is adjacent to an edge of each of said drain region and said source region;

an insulating layer disposed over said floating gate;

a first conductive region disposed over said insulating layer and capacitively coupled to said floating gate;

a tunneling junction disposed between said floating gate and a second conductive region;

means for applying a first positive potential to said drain region with respect to said p– type region to reverse bias said drain region with respect to said p– type region, said first positive potential having a magnitude of greater than about +2.5 volts relative to said p– type region, but less than the voltage required to induce avalanche breakdown in a junction formed between said drain region and said p– type region;

means for capacitively coupling a second positive potential to said floating gate, said second positive potential having a magnitude of greater than about +2.5 volts relative to said p– type region;

means for applying a third potential to said source region with respect to said p– type region, said third potential in the range of about zero to about +2.0 volts relative to said p– type region; and means for selectively applying a fourth positive potential to said second conductive region, said fourth potential being positive with respect to said floating gate.

15. An analog memory cell comprising:

a semiconductor substrate including a p– type region;

a first n+ type region disposed in said p– type region;

a second n+ type region disposed in said p– type region;

a channel disposed between said first n+ type region and said second n+ type region, said channel additionally p doped to an impurity level in the range of about 1E17/cm³ to about 2E17/cm³;

a floating gate disposed above said channel and separated from said channel by a layer of gate oxide;

an insulating layer disposed over said floating gate;

a first conductive region disposed over said insulating layer and capacitively coupled to said floating gate;

a tunneling junction disposed between said floating gate and a second conductive region means for applying a first positive potential to said second n+ type region with respect to said p− type region to reverse bias said second n+ type region with respect to said p− type region, said first positive potential having a magnitude of greater than about +2.5 volts relative to said p− type region, but less than the voltage required to induce avalanche breakdown in a junction formed between said second n+ type region and said p− type region;

means for capacitively coupling a second positive potential to said floating gate, said second positive potential having a magnitude of greater than about +2.5 volts relative to said p− type region;

means for applying a third potential to said first n+ type region with respect to said p− type region, said third potential in the range of about zero to about +2.0 volts relative to said p− type region; and means for selectively applying a fourth potential to said second conductive region, said fourth potential being positive with respect to said floating gate.

16. An analog memory cell comprising:

a semiconductor substrate including a p− type region;

a first n+ type region disposed in said p− type region;

a second n+ type region disposed in said p− type region;

a channel disposed between said first n+ type region and said second n+ type region, said channel additionally p doped to an impurity level in the range of about 1E17/cm³ to about 2E17/cm³;

a floating gate disposed above said channel and extending over a portion of said first and second n+ doped regions and separated from said channel and said first and second n+ doped regions by a layer of gate oxide;

an insulating layer disposed over said floating gate;

a first conductive region disposed over said insulating layer and capacitively coupled to said floating gate;

a tunneling junction disposed between said floating gate and a second conductive region, said tunneling junction including a portion of said insulating layer;

means for applying a first positive potential to said second n+ type region with respect to said p− type region to reverse bias said second n+ type region with respect to said p− type region, said first positive potential having a magnitude of greater than about +2.5 volts relative to said p− type region, but less than the voltage required to induce avalanche breakdown in a junction formed between said second n+ type region and said p− type region;

means for capacitively coupling a second positive potential to said floating gate, said second positive potential having a magnitude of greater than about +2.5 volts relative to said p− type region;

means for applying a third potential to said first n+ type region with respect to said p− type region, said third potential in the range of about zero to about +2.0 volts relative to said p− type region; and means for selectively applying a fourth potential to said second conductive region, said fourth potential being positive with respect to said floating gate.

17. An analog memory cell comprising:

a semiconductor substrate including a p− type region;

a first n+ type region disposed in said p− type region;

a second n+ type region disposed in said p− type region;

a channel disposed between said first n+ type region and said second n+ type region, said channel additionally p doped to an impurity level in the range of about 1E17/cm³ to about 2E17/cm³;

a floating gate disposed above said channel and extending over a portion of said first and second n+ doped regions and separated from said channel and said n+ doped regions by a layer of gate oxide;

an insulating layer disposed over said floating gate;

a first conductive region disposed over said insulating layer and capacitively coupled to said floating gate;

a tunneling junction disposed between said floating gate and a second conductive region, said tunneling junction including a portion of said insulating layer;

means for applying a first positive potential to said second n+ type region with respect to said p− type region to reverse bias said second n+ type region with respect to said p− type region, said first positive potential having a magnitude of greater than about +2.5 volts relative to said p− type region, but less than the voltage required to induce avalanche breakdown in a junction formed between said second n+ type region and said p− type region;

means for capacitively coupling a second positive potential to said floating gate, said second positive potential having a magnitude of greater than about +2.5 volts relative to said p− type region;

means for applying a third potential to said first n+ type region with respect to said p− type region, said third potential in the range of about zero to about +2.0 volts relative to said p− type region; and means for selectively applying a fourth potential to said second conductive region, said fourth potential being positive with respect to said floating gate.

18. An analog memory cell comprising:

a semiconductor substrate including a p− type region;

a first n+ type region disposed in said p− type region;

a second n+ type region disposed in said p− type region;

a channel disposed between said first n+ type region and said second n+ type region, said channel additionally p doped to an impurity level in the range of about 1E17/cm³ to about 2E17/cm³;

a floating gate disposed above said channel and separated from said channel by a first insulating layer;

a second insulating layer disposed over said floating gate;

a first conductive region disposed over said second insulating layer and capacitively coupled to said floating gate;

means for applying a first positive potential to said second n+ type region with respect to said p− type region to reverse bias said second n+ type region with respect to said p− type region, said first positive potential having a magnitude of greater than about +2.5 volts relative to said p− type region, but less than the voltage required to induce avalanche breakdown in a junction formed between said second n+ type region and said p− type region;

means for capacitively coupling a second positive potential to said floating gate, said second positive potential having a magnitude of greater than about +2.5 volts relative to said p– type region;

means for applying a third potential to said first n+ type region with respect to said p– type region, said third potential in the range of about zero to about +2.0 volts relative to said p– type region; and a tunneling junction for causing electrons to tunnel from said floating gate to a second conductive region, in response to selective application of a fourth potential to said second conductive region, said fourth potential being positive with respect to said floating gate.

19. A semiconductor structure for long term learning comprising:

a p– type region in a semiconductor substrate;

a first n+ type region disposed in said p– type region;

a second n+ type region disposed in said p– type region;

a floating gate disposed over a channel implant region and separated from said channel implant region by a first insulating layer, said channel implant region disposed in said p– type region between said first n+ type region and said second n+ type region;

means for capacitively coupling a positive potential to said floating gate, said positive potential having a magnitude of greater than about +2.5 volts relative to said p– type region;

a tunneling junction region disposed adjacent to a portion of said floating gate;

a second insulating layer disposed over said floating gate;

a conductive region disposed over said second insulating layer and capacitively coupled to said floating gate.

20. The semiconductor structure according to claim 19 wherein said channel implant region is additionally p doped.

21. The semiconductor structure according to claim 19 wherein said tunneling junction comprises a second conductive region separated from said floating gate by an insulating material.

22. The semiconductor structure according to claim 20 wherein said tunneling junction comprises a second conductive region separated from said floating gate by an insulating material.

23. A semiconductor structure for long term learning comprising:

a p– type region in a semiconductor substrate;

a first n+ type region disposed in said p– type region;

a second n+ type region disposed in said p– type region;

an n– type region disposed in said p– type region, said n– type region including an n+ doped region surrounded by said n– type region within said p– type region;

a floating gate disposed over a channel implant region and separated from said channel implant region by a first insulating layer, said channel implant region disposed in said p– type region between said first n+ type region and said second n+ type region;

means for capacitively coupling a positive potential to said floating gate, said positive potential having a magnitude of greater than about +2.5 volts relative to said p– type region;

a second insulating layer disposed over said floating gate;

a conductive region disposed over said second insulating layer and capacitively coupled to said floating gate.

24. The semiconductor structure according to claim 23 wherein said channel implant region is additionally p doped.

25. An analog memory cell comprising:

a p– type region in a semiconductor substrate;

a first n+ type region disposed in said p– type region;

a second n+ type region disposed in said p– type region;

a floating gate disposed over a channel implant region and separated from said channel implant region by a first insulating layer, said channel implant region disposed in said p– type region between said first n+ type region and said second n+ type region;

means for capacitively coupling a positive potential to said floating gate, said positive potential having a magnitude of greater than about +2.5 volts relative to said p– type region;

a tunneling junction region disposed adjacent to a portion of said floating gate;

a second insulating layer disposed over said floating gate;

a conductive region disposed over said second insulating layer and capacitively coupled to said floating gate.

26. The semiconductor structure according to claim 25 wherein said channel implant region is additionally p doped.

27. The semiconductor structure according to claim 26 wherein said tunneling junction comprises a second conductive region separated from said floating gate by an insulating material.

28. The semiconductor structure according to claim 25 wherein said tunneling junction comprises a second conductive region separated from said floating gate by an insulating material.

29. An analog memory cell comprising:

a p– type region in a semiconductor substrate;

a first n+ type region disposed in said p– type region;

a second n+ type region disposed in said p– type region;

an n– type region disposed in said p– type region, said n– type region including an n+ doped region surrounded by said n– type region within said p– type region;

a floating gate disposed over a channel implant region and separated from said channel implant region by a first insulating layer, said channel implant region disposed in said p– type region between said first n+ type region and said second n+ type region;

means for capacitively coupling a positive potential to said floating gate, said positive potential having a magnitude of greater than about +2.5 volts relative to said p– type region;

a second insulating layer disposed over said floating gate;

a conductive region disposed over said second insulating layer and capacitively coupled to said floating gate.

30. The analog memory cell according to claim 29 wherein said channel implant region is additionally p doped.

31. A semiconductor structure for long term learning comprising:

a p– type region in a semiconductor substrate;

a first n+ type region disposed in said p– type region;

a second n+ type region disposed in said p– type region;

a floating gate disposed over a channel implant region and separated from said channel implant region by a first insulating layer, said channel implant region disposed in said p– type region between said first n+ type region and said second n+ type region, and said channel implant region additionally p doped;

a tunneling junction region disposed adjacent to a portion of said floating gate, said tunneling junction region including a second conductive region separated from said floating gate by an insulating material;

a second insulating layer disposed over said floating gate;

a conductive region disposed over said second insulating layer and capacitively coupled to said floating gate;

means for selectively causing electrons to inject from said channel implant region through said first insulating layer into said floating gate;

means for selectively causing electrons to tunnel from said floating gate through said tunneling junction region.

32. The semiconductor structure according to claim 31 including means for simultaneously executing said electron injection and said electron tunneling.

33. A semiconductor structure for long term learning comprising:

a p– type region in a semiconductor substrate;

a first n+ type region disposed in said p– type region;

a second n+ type region disposed in said p– type region;

an n– type region disposed in said p– type region, said n– type region including an n+ doped region surrounded by said n– type region within said p– type region;

a floating gate disposed over a channel implant region and separated from said channel implant region by a first insulating layer, said channel implant region disposed in said p– type region between said first n+ type region and said second n+ type region, and said channel implant region additionally p doped;

a second insulating layer disposed over said floating gate;

a conductive region disposed over said second insulating layer and capacitively coupled to said floating gate;

means for selectively causing electrons to inject from said channel implant region through said first insulating layer into said floating gate;

means for selectively causing electrons to tunnel from said floating gate to said n+ doped region through said first insulating layer.

34. The semiconductor structure according to claim 33 including means for simultaneously executing said electron injection and said electron tunneling.

35. An analog memory cell comprising:

a p– type region in a semiconductor substrate;

a first n+ type region disposed in said p– type region;

a second n+ type region disposed in said p– type region;

a floating gate disposed over a channel implant region and separated from said channel implant region by a first insulating layer, said channel implant region disposed in said p– type region between said first n+ type region and said second n+ type region, and said channel implant region additionally p doped;

a tunneling junction region disposed adjacent to a portion of said floating gate, said tunneling junction region including a second conductive region separated from said floating gate by a first insulating layer;

a second insulating layer disposed over said floating gate;

a conductive region disposed over said second insulating layer and capacitively coupled to said floating gate;

means for selectively causing electrons to inject from said channel implant region through said first insulating layer into said floating gate;

means for selectively causing electrons to tunnel from said floating gate through said tunneling junction region.

36. The analog memory cell according to claim 35 including means for simultaneously executing said electron injection and said electron tunneling.

37. An analog memory cell comprising:

a p– type region in a semiconductor substrate;

a first n+ type region disposed in said p– type region;

a second n+ type region disposed in said p– type region;

an n– type region disposed in said p– type region, said n– type region including an n+ doped region surrounded by said n– type region within said p– type region;

a floating gate disposed over a channel implant region and separated from said channel implant region by a first insulating layer, a portion of said floating gate also disposed over said n– type region, said channel implant region disposed in said p– type region between said first n+ type region and said second n+ type region, and said channel implant region additionally p doped;

a second insulating layer disposed over said floating gate;

a conductive region disposed over said second insulating layer and capacitively coupled to said floating gate;

means for selectively causing electrons to inject from said channel implant region through said insulator into said floating gate;

means for selectively causing electrons to tunnel electrons from said floating gate to said n+ doped region through said first insulating layer.

38. The analog memory cell according to claim 37 including means for simultaneously executing said electron injection and said electron tunneling.

39. A semiconductor structure for long term learning comprising:

a p– type region in a semiconductor substrate;

a first n+ type region disposed in said p– type region;

a second n+ type region disposed in said p– type region;

a floating gate disposed over a channel implant region and separated from said channel implant region by a first insulating layer, said channel implant region disposed in said p– type region between said first n+ type region and said second n+ type region, and said channel implant region additionally p doped;

a tunneling junction region disposed adjacent to a portion of said floating gate, said tunneling junction region including a second conductive region separated from said floating gate by an insulating material;

a second insulating layer disposed over said floating gate;

a conductive region disposed over said second insulating layer and capacitively coupled to said floating gate;

means for simultaneously adding and removing electrons to and from said floating gate, wherein said electron addition is accomplished though selective use of electron injection and said electron removal is accomplished through selective use of electron tunneling.

40. A semiconductor structure for long term learning comprising:

a p– type region in a semiconductor substrate;

a first n+ type region disposed in said p– type region;

a second n+ type region disposed in said p– type region;

an n– type region disposed in said p– type region, said n– type region including an n+ doped region surrounded by said n– type region within said p– type region;

a floating gate disposed over a channel implant region and separated from said channel implant region by a first insulating layer, said channel implant region disposed in said p– type region between said first n+ type region and said second n+ type region, and said channel implant region additionally p doped;

a second insulating layer disposed over said floating gate;

a conductive region disposed over said second insulating layer and capacitively coupled to said floating gate;

means for simultaneously adding and removing electrons to and from said floating gate, wherein said electron addition is accomplished through selective use of electron injection and said electron removal is accomplished through selective use of electron tunneling.

41. An analog memory cell comprising:

a p– type region in a semiconductor substrate;

a first n+ type region disposed in said p– type region;

a second n+ type region disposed in said p– type region;

a floating gate disposed over a channel implant region and separated from said channel implant region by a first insulating layer, said channel implant region disposed in said p– type region between said first n+ type region and said second n+ type region, and said channel implant region additionally p doped;

a tunneling junction region disposed adjacent to a portion of said floating gate, said tunneling junction region including a conductive region separated from said floating gate by a first insulating layer;

a second insulating layer disposed over said floating gate;

a second conductive region disposed over said second insulating layer and capacitively coupled to said floating gate;

means for simultaneously adding and removing electrons to and from said floating gate, wherein said electron addition is accomplished though selective use of electron injection and said electron removal is accomplished through selective use of electron tunneling.

42. An analog memory cell comprising:

a p– type region in a semiconductor substrate;

a first n+ type region disposed in said p– type region;

a second n+ type region disposed in said p– type region;

an n– type region disposed in said p– type region, said n– type region including an n+ doped region surrounded by said n– type region within said p– type region;

a floating gate disposed over a channel implant region and separated from said channel implant region by a first insulating layer, a portion of said floating gate also disposed over said n– type region, said channel implant region disposed in said p– type region between said first n+ type region and said second n+ type region, and said channel implant region additionally p doped;

a second insulating layer disposed over said floating gate;

a conductive region disposed over said second insulating layer and capacitively coupled to said floating gate;

means for simultaneously adding and removing electrons to and from said floating gate, wherein said electron addition is accomplished through selective use of electron injection and said electron removal is accomplished through selective use of electron tunneling.

\* \* \* \* \*

UNITED STATES PATENT AND TRADEMARK OFFICE
CERTIFICATE OF CORRECTION

PATENT NO. : 5,627,392

DATED : May 6, 1997

INVENTOR(S) : Christopher J. Diorio, Paul E. Hasler, Bradley A. Minch and Carver A. Mead It is certified that error appears in the above-indentified patent and that said Letters Patent is hereby corrected as shown below:

The title page should be deleted and substitute therefor the attached title page.

IN THE DRAWINGS

Delete Drawing Sheets 4 and 8, and substitute therefor the Drawing Sheets consisting of FIGS. 3A and 6-7, as shown on the attached pages.

Column 5, line 8: replace "process" with --processes--.

Column 5, line 24: replace "g ate" with --gate--.

Column 6, line 16: replace "take" with --taken--.

Column 7, line 28: replace "400 Å," with --400Å--.

Column 10, line 42: replace "row 56" with --row 58--.

Column 11, lines 34-36: replace "FIG. 3C is a top view of an alternative embodiment of the single transistor analog memory cell and FIG. 3D is a cross-sectional view" with --FIG. 3D is a top view of an alternative embodiment of the single transistor analog memory cell and FIG. 3C is a cross-sectional view--.

Column 11, line 36: please replace "take" with --taken--.

Column 12, line 63: replace "it s selected" with --it is selected--.

In the claims:

Column 14, lines 44-45, replace "additionally p doped region having an impurity level" with --additionally p doped with p-base to an impurity level--.

UNITED STATES PATENT AND TRADEMARK OFFICE
CERTIFICATE OF CORRECTION

PATENT NO. : 5,627,392
DATED : May 6, 1997
INVENTOR(S) : Christopher J. Diorio, Paul E. Hasler, Bradley A. Minch and Carver A. Mead It is certified that error appears in the above-indentified patent and that said Letters Patent is hereby corrected as shown below:

Column 24, line 21: replace "selectively causing electrons to tunnel electrons from" to --selectively causing electrons to tunnel from--.

Signed and Sealed this

Sixth Day of January, 1998

*Attest:*

BRUCE LEHMAN

*Attesting Officer*  *Commissioner of Patents and Trademarks*

United States Patent [19]
Diorio et al.

[11] Patent Number: 5,627,392
[45] Date of Patent: May 6, 1997

[54] SEMICONDUCTOR STRUCTURE FOR LONG TERM LEARNING

[75] Inventors: Christopher J. Diorio, Torrance; Paul E. Hasler, Pasadena; Bradley A. Minch, Pasadena; Carver A. Mead, Pasadena, all of Calif.

[73] Assignee: California Institute of Technology, Pasadena, Calif.

[21] Appl. No.: 399,966

[22] Filed: Mar. 7, 1995

[51] Int. Cl.⁶ .................................................. H01L 29/788
[52] U.S. Cl. ........................... 257/315; 257/316; 257/321; 257/345; 365/185.03; 365/185.28
[58] Field of Search ................................ 257/315, 316, 257/317, 321, 322, 345; 365/185, 189

[56] References Cited

U.S. PATENT DOCUMENTS

| | | | |
|---|---|---|---|
| 4,622,656 | 11/1986 | Kamiya et al. | 365/185 |
| 4,822,750 | 4/1989 | Perlegos et al. | 437/52 |
| 4,935,702 | 6/1990 | Mead et al. | 330/9 |
| 4,953,928 | 9/1990 | Anderson et al. | 357/23.5 |
| 5,059,920 | 10/1991 | Anderson et al. | 330/253 |
| 5,068,622 | 11/1991 | Mead et al. | 330/253 |
| 5,160,899 | 11/1992 | Anderson et al. | 330/288 |
| 5,166,562 | 11/1992 | Allen et al. | 307/571 |
| 5,331,215 | 7/1994 | Allen et al. | 307/201 |
| 5,336,936 | 8/1994 | Allen et al. | 307/201 |
| 5,345,418 | 9/1994 | Challa | 365/185 |

OTHER PUBLICATIONS

For Background Information: Electronic Engineering Times, Monday, Jul. 3, 1995, Issue 855, pp. 1, 31, "Carver Mead's CalTech lab unveils its VLSI cerebral-cortex: Neural team bares silicon brain", R. Colin Johnson.

For Background Information: Electronic Engineering Times, Monday, Jul. 17, 1995, Issue 857, pp. 1, 37–38, "Analog and digital techniques to create a new 'art form': Mead envisions new design era", R. Colin Johnson.

Bertrand Hochet, et al., "Implementation of a Learning Kohonen Neuron Based on a New Multilevel Storage Technique", IEEE J. Solid-State Circuits, vol. 26, No. 3, Mar. 1991, pp. 262–267.

Sanchez, et al., "Review of carrier injection in the silicon/silicon-dioxide system", IEE Proceedings-G, vol. 138, No. 3, Jun. 1991, pp. 377–389.

John Lazzaro, et al., "Systems Technologies for Silicon Auditory Models", IEEE Micro, Jun. 1994, pp. 7–15.

Paul W. Hollis, et al., "A Neural Network Learning Algorithm Tailored for VLSI Implementation", IEEE Trans. on Neural Networks, vol. 5, No. 5, Sep. 1994, pp. 784–791.

*Primary Examiner*—Minhloan Tran
*Attorney, Agent, or Firm*—D'Alessandro & Ritchie

[57] ABSTRACT

A silicon MOS transistor with a time-varying transfer function is provided which may operate both as a single transistor analog learning device and as a single transistor non-volatile analog memory. The time-varying transfer function is achieved by adding or removing electrons from the fully insulated floating gate of an N-type MOS floating gate transistor. The transistor has a control gate capacitively coupled to the floating gate; it is from the perspective of this control gate that the transfer function of the transistor is modified. Electrons are removed from the floating gate via Fowler-Nordheim tunneling. Electrons are added to the floating gate via hot-electron injection.

42 Claims, 9 Drawing Sheets

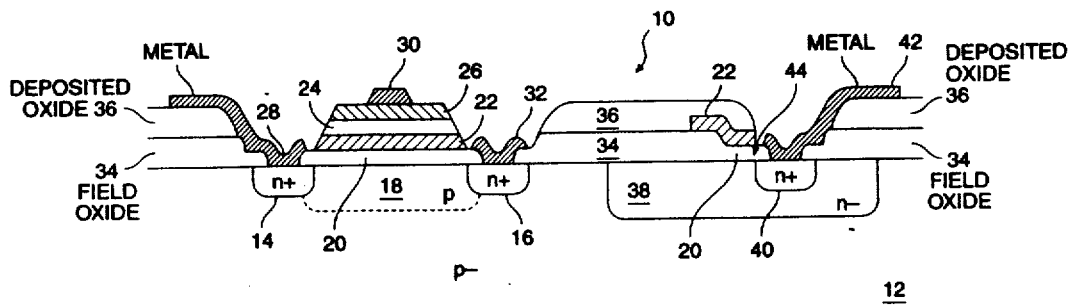

8/9